(12) United States Patent
Sheperek et al.

(10) Patent No.: US 11,061,752 B2
(45) Date of Patent: Jul. 13, 2021

(54) DYNAMIC PROGRAMMING OF PAGE MARGINS

(71) Applicant: Micron Technology, Inc., Boise, ID (US)

(72) Inventors: Michael Sheperek, Longmont, CO (US); Larry J. Koudele, Erie, CO (US); Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 56 days.

(21) Appl. No.: 16/514,644

(22) Filed: Jul. 17, 2019

(65) Prior Publication Data

US 2021/0019208 A1    Jan. 21, 2021

(51) Int. Cl.
| | |
|---|---|
| *G06F 11/00* | (2006.01) |
| *G06F 11/07* | (2006.01) |
| *G11C 16/08* | (2006.01) |
| *G11C 16/28* | (2006.01) |
| *G11C 16/10* | (2006.01) |

(52) U.S. Cl.
CPC ........... *G06F 11/076* (2013.01); *G11C 16/08* (2013.01); *G11C 16/10* (2013.01); *G11C 16/28* (2013.01)

(58) Field of Classification Search
None
See application file for complete search history.

(56) References Cited

U.S. PATENT DOCUMENTS

| | | | | |
|---|---|---|---|---|
| 9,142,272 | B2* | 9/2015 | Van Huben | G11C 5/04 |
| 10,140,040 | B1* | 11/2018 | Koudele | G11C 29/021 |
| 2012/0278535 | A1* | 11/2012 | Yeh | G06F 11/1435 |
| | | | | 711/103 |
| 2016/0179406 | A1* | 6/2016 | Gorobets | G11C 11/5628 |
| | | | | 711/103 |
| 2019/0171381 | A1* | 6/2019 | Ioannou | G06F 3/0679 |
| 2019/0243699 | A1* | 8/2019 | Jin | G06F 11/073 |

OTHER PUBLICATIONS

C. Kim, C. Park, S. Yoo and S. Lee, "Extending lifetime of flash memory using strong error correction coding," in IEEE Transactions on Consumer Electronics, vol. 61, No. 2, pp. 206-214, May 2015, doi: 10.1109/TCE.2015.7150595. (Year: 2015).*

* cited by examiner

*Primary Examiner* — Daniel F. McMahon
(74) *Attorney, Agent, or Firm* — Lowenstein Sandler LLP

(57) ABSTRACT

Center error counts are determined for logical page types of the memory component. A first center error count is indicative of a number of bit errors for a first logical page type. A second center error count is indicative of a number of bit errors for a second logical page type. A modified page margin is determined based on a current page margin corresponding to the first logical page type. The current page margin corresponds to the first logical page type and is indicative of a ratio of the first center error count to the second center error count. The modified page margin is indicative of a modified ratio of a modified first center error count to the second center error count. The current page margin is adjusted corresponding to the first logical page type in accordance with the modified page margin.

20 Claims, 11 Drawing Sheets

```
                                      ┌─ 250
                                      ▼

┌─────────────────────────────────────────────────────────────────────┐
│ Receive a first center error count associated with a first logical  │
│ page type of the memory component and a second center error count   │
│ associated with a second logical page type of the memory component  │
│                               255                                   │
└─────────────────────────────────────────────────────────────────────┘
                                  │
                                  ▼
┌─────────────────────────────────────────────────────────────────────┐
│ Generate a modified page margin based on a current page margin      │
│ associated with the first logical page type by modifying the first  │
│ center error count by a first scale factor                          │
│                               260                                   │
└─────────────────────────────────────────────────────────────────────┘
                                  │
                                  ▼
┌─────────────────────────────────────────────────────────────────────┐
│ Adjust one or more program verify (PV) targets associated with      │
│ programming distributions of the memory component in accordance     │
│ with the modified page margin                                       │
│                               265                                   │
└─────────────────────────────────────────────────────────────────────┘
```

FIG. 2B

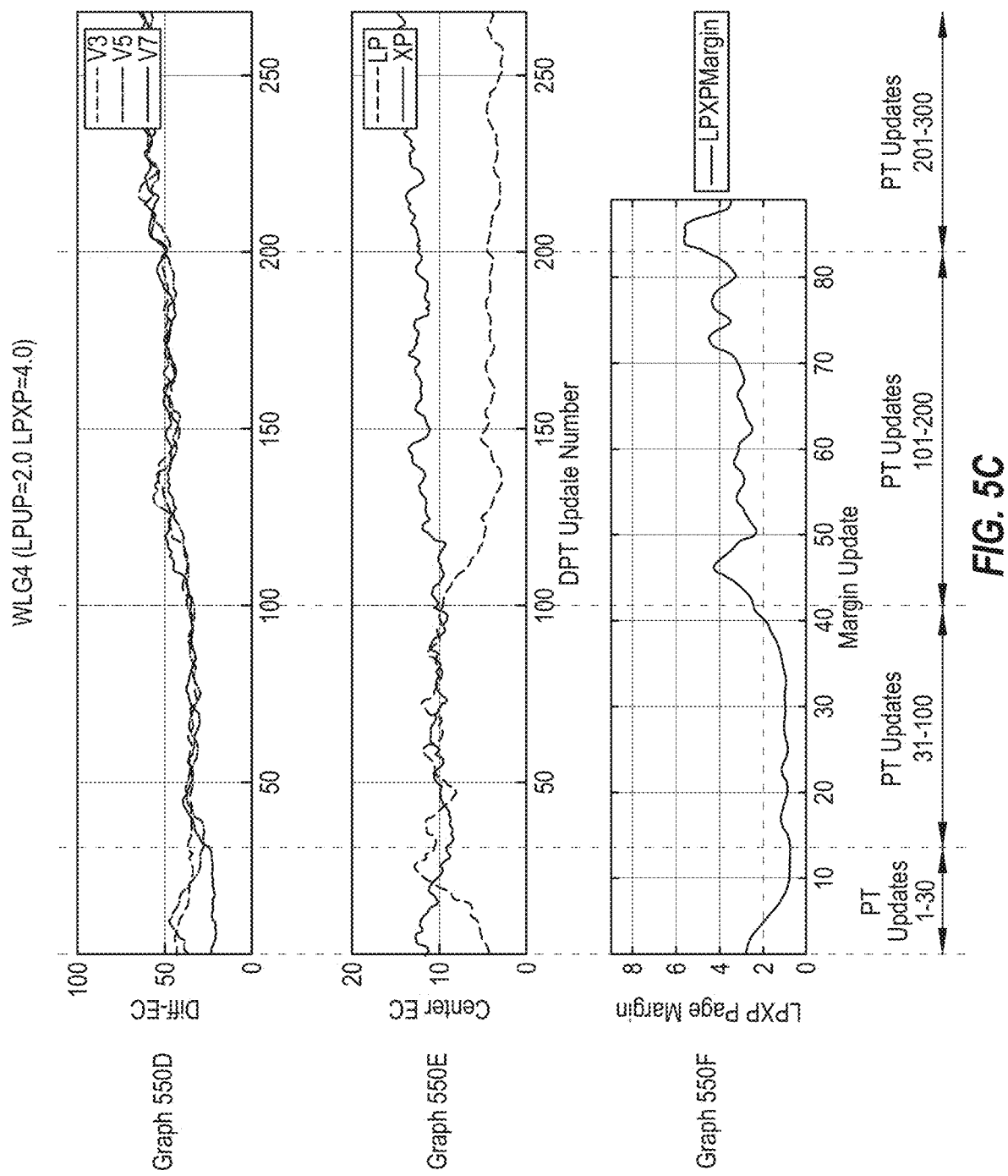

DYNAMIC PROGRAMMING OF PAGE MARGINS

TECHNICAL FIELD

Embodiments of the disclosure relate generally to memory sub-systems, and more specifically, relate to the programming of page margins associated with memory cells of a memory sub-system.

BACKGROUND

A memory sub-system can be a storage system, a memory module, or a hybrid of a storage device and memory module. A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure.

FIG. 2B is a flow diagram of an example method of adjusting one or more program verify (PV) targets according to a modified page margin, in accordance with some embodiments of the disclosure.

FIGS. 5B and 5C show graphs that illustrate program targeting (PT) operations that adjust the current page margins of a logical page types according to the modified page margins, in accordance with embodiments of the disclosure.

DETAILED DESCRIPTION

Figure 1:
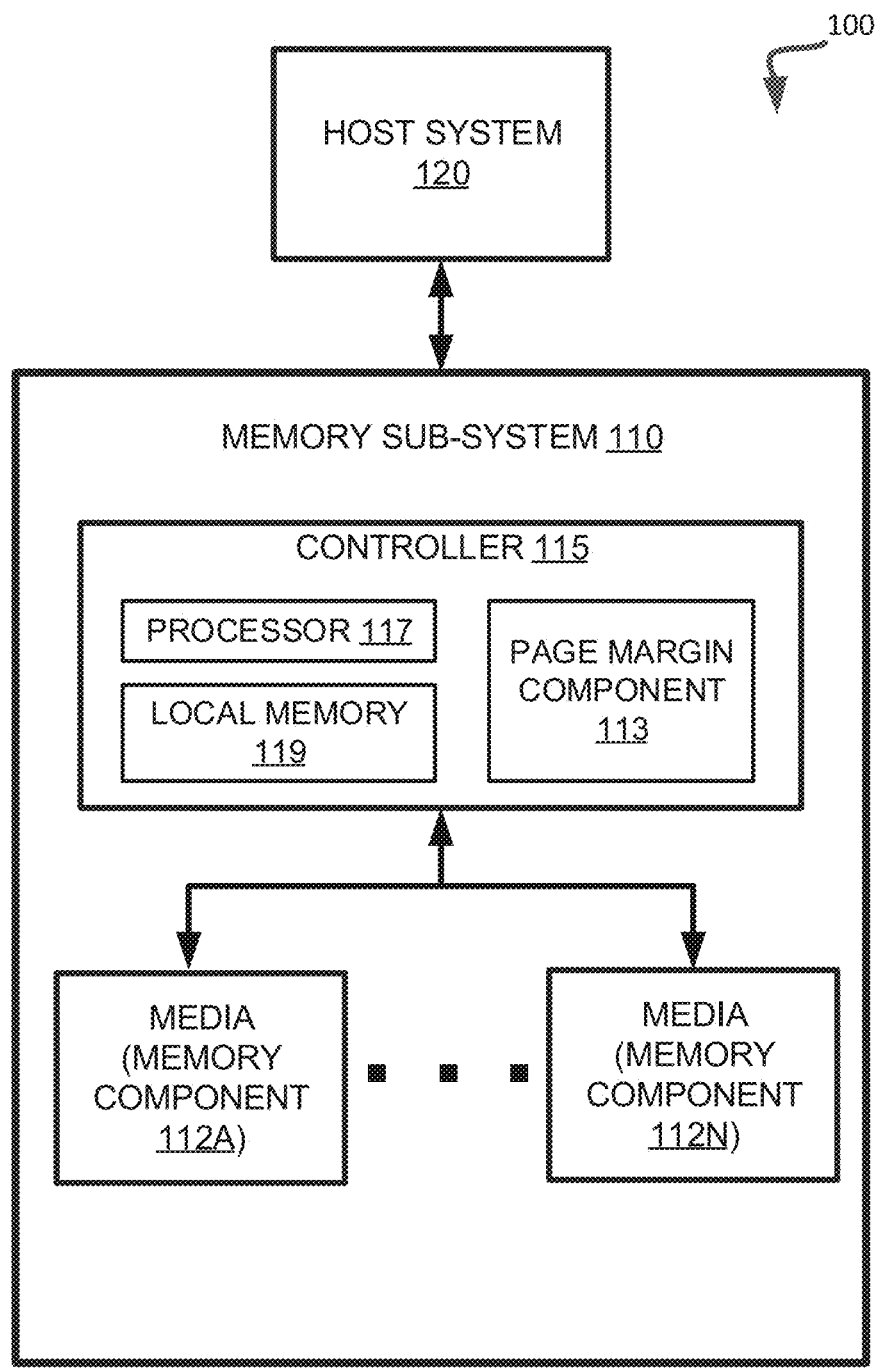
FIG. 1 illustrates an example computing environment that includes a memory sub-system in accordance with some embodiments of the disclosure.

Aspects of the present disclosure are directed to adjusting the current page margin corresponding to a logical page type in accordance with a modified page margin. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

A single-level cell (SLC) can store only one bit per memory element, whereas a multi-level cell (MLC) is a memory element that is capable of storing more than a single bit of information. It should be noted that the state of the memory cell can be programmed and the state of the memory can be determined by comparing a read voltage of the memory cell against one or more read level thresholds. That is, with SLC NAND flash technology, each cell can exist in one of two states, storing one bit of information per cell, whereas MLC NAND flash memory has four or more possible states per cell, so each MLC-based cell can store two or more bits of information per cell. The higher number of possible states reduces the amount of margin (e.g., valley margin or voltage range) separating the states. The memory device can include triple-level cell (TLC) memory. In TLC memory, the memory cell stores three bits of information per cell with eight total voltage states. The memory device can include a quad-level cell (QLC) memory. In QLC memory, each memory cell can store four bits of information with sixteen voltage states. For example, in a QLC memory, a memory cell can store four bits of data (e.g., 1111, 0000, 1101, etc.) corresponding to data received from the host system using the sixteen voltage states. It can be noted that operations herein can be applied to any multi-bit memory cells.

Each bit of the memory cell is stored at a different portion (also referred to as "logical page" hereafter) of the memory cell. Various read level thresholds can be used for the various logical page types (also referred to as "page types" herein): SLC logical page types are lower logical pages (LPs), MLC logical page types are LPs and upper logical pages (UPs), TLC logical page types are LPs, UPs, and extra logical pages (XPs), and QLC logical page types are LPs, UPs, XPs and top logical pages (TPs). For example, a memory cell of the QLC memory can have a total of four logical pages, including a lower logical page (LP), an upper logical page (UP), an extra logical page (XP) and a top logical page (TP), where each logical page stores a bit of data. For example, a bit can be represented by each of the four logical pages of the memory cell. In a memory cell for QLC memory, each combination of four bits can correspond to a different voltage level (also referred to as "level" hereafter). For example, a first level of the memory cell can correspond to 1111, a second level can correspond to 0111, and so on. Because a memory cell for a QLC memory includes 4 bits of data, there are a total of 16 possible combinations of the four bits of data. Accordingly, a memory cell for a QLC memory can be programmed to one of 16 different levels.

In embodiments, the memory system receives a request from a host system to perform a programming operation to store data at the QLC memory (or other memory components having memory cells that store two or more bits). The memory system can store the data by performing multi-pass programming (e.g., two or more programming passes) that programs or stores data at the memory cell. A first programming pass can program data at the memory cell at a particular time. At a later time, a second programming pass can be performed on the memory cell to store additional data at the memory cell. The second programming pass uses the information stored in the first programming pass. A certain amount of time can elapse between the memory sub-system performing the first programming pass and performing the second programming pass on the same memory cell. During a first programming pass of a two-pass programming operation, one or more voltage levels can be applied to the memory cell to program a first set of bits (e.g., 3 bits in 3 logical pages). During a second programming pass of the two-pass programming operation, one or more voltage levels can be applied to the memory cell to program an additional bit to the first set of bits (e.g., 4 bits in 4 logical pages). The level that the memory cell is programmed to in the second programming pass can be based on the last logical page of the memory cell as well as the prior logical pages that were programmed at the memory cell in the first programming pass.

The continuous read level calibration (cRLC) operation is an operation that can be performed for each of the multiple read level threshold registers used during all read operations. A read level threshold register can store a value that indicates the read level threshold voltage (also referred to as "read level threshold" herein) for a particular valley. The read level threshold voltage can be used to read data from the memory cell. The cRLC operation can be performed to keep each read level threshold centered so that the memory component can achieve the best overall bit error rate (BER) possible. The cRLC operation is referred to as continuous because the operation samples continually and dynamically at discrete intervals. For example, a sample, which can be a set of three reads, can be made at about 1 sample operation in every 1 to 30 seconds, depending on the requirements. Each sample initiated by the cRLC operation returns sample data for a particular die and a particular logical page type so that over many of these operations the information is aggregated and fed back in a closed loop system such that each die or read level threshold is kept calibrated (e.g., the read level threshold is centered). In one implementation, a sample is three reads from the same read threshold valley (e.g., also referred to as "valley" or "Vt distribution valley" herein). The read level thresholds of the memory component can start with manufacturing default read level thresholds. The cRLC operation can be run during a test mode so that all read level offset trims of all word line groups (WLGs) of all dies in the memory system are calibrated (also referred to as "converged" herein). A memory cell (or WLG or memory component, etc.) that is calibrated or converged by cRLC has a center value that corresponds to a read level threshold (or read level trim) that is centered in or at a lowest point in the read threshold valley. A memory cell (or WLG or memory component, etc.) that is calibrated or converged by cRLC has a center value that results in a lowest bit error rate (BER). BER can refer to a ratio of a number of bits in error of a data vector divided by a total number of bits for the given data vector. BER can correspond to a particular logical page type. For example, a particular logical page type has a particular BER and another logical page type has another BER. A trim can refer to digital value that is used for a circuit, such as a register, that is converted into an analog voltage value. For example, the read level threshold trims can be programmed into a trim register, which produces a read level threshold voltage used to read data from a memory cell.

A continuous read level calibration (cRLC) operation continuously measures and collects information about the valley margins to determine metrics such as a difference error count (Diff-EC). The valley margin can refer to a relative width (also referred to as "margin" herein) between pairs of adjacent programming distributions. Diff-EC is a metric derived from measurements taken at a valley between two adjacent programming distributions. In performing the cRLC operation, a set of three reads can be performed at any particular valley of any logical page type. The cRLC operation can make the set of three reads at three read voltage values: 1) a center value (e.g., corresponds to a read level threshold that is centered in or at a lowest point in the read threshold valley), 2) a negative offset value (e.g., the center value less a negative offset), and 3) a positive offset value (e.g., the center value plus the positive offset). A read sample at each of the three read voltage values can be compared to an expected read sample. If the read sample is different than the expected read sample, a bit error for the particular read voltage value can be determined. The bit errors for each read voltage value can be counted across multiple cRLC sampling operations to determine a CenterEC (e.g., center sample bit error count) associated with the center value, a negative offset sample bit error count for the negative offset value, and a positive offset sample bit error count for the positive offset value. In some examples, the Diff-EC measurement is the difference between the average of the negative offset bit error count and the positive offset bit error count, and the center sample bit error count.

In some instances, a difference error count (Diff-EC) can be correlated to a valley margin between pairs of adjacent programming distributions. For example, valley margin(s) associated with a particular logical page type can indicate the relative width between pairs of programming distributions associated with the particular logical page type. For instance, a first valley margin of an upper logical page (e.g., valley 2 that is between the $2^{nd}$ distribution (L1) and $3^{rd}$ distribution(L2)) that is larger than a second valley margin of the upper logical page (e.g., valley 6 that is between the $6^{th}$ distribution (L5) and the $7^{th}$ distribution (L6)) can indicate that the first valley is larger than the second valley (e.g., valley 2 is larger than valley 6), but does not explicitly recite the absolute width or size of either valley.

Valley margin can be correlated with a read window budget (RWB), and a difference error count (Diff-EC) can be correlated to relative RWB of valleys for a particular logical page type. Read window budget for a valley can refer to an absolute measurement in volts (e.g., millivolts (mV)) between two adjacent programming distributions. For example, the RWB for valley 2 can be 270 mV and the RWB for valley 6 can be 250 mV. If, for example, the first valley margin is larger than the second valley margin, then a correlation that the RWB of the first valley margin is larger than the RWB of the second valley margin can be made. In another example, two valleys of a particular logical page type with the same Diff-EC value have approximately the same valley margin. Since the two valleys have the same valley margin, it can be inferred that the two valleys have approximately the same RWB, even though the absolute RWB is not measured. In some instances, a value for RWB is not readily measureable, and Diff-EC measurements are used to determine relative valley margins.

In some embodiments, Diff-EC is inversely proportional to valley margin. For example, if a first valley of a first logical page type has a higher Diff-EC than a second valley of the first logical page type, it can be inferred that the first valley has less valley margin than the second valley, and that the first valley has less RWB than the second valley.

The cRLC operation measures and collects additional information about the valley margins to determine metrics such as the center error count (CenterEC) (also referred to as the "center bit error count" or "center sample bit error count" herein). CenterEC is a metric indicative of the bit error count (e.g., number of bit errors) for the center sample of each trim (e.g., each read level threshold) for a particular logical page type. For example, an upper logical page type is associated with two valleys (e.g., valley 2 and valley 6). A cRLC operation can perform multiple reads of the upper logical page using the read level threshold for valley 2 and the read level threshold for valley 6. In an example, responsive to the reads, cRLC records 3 bit errors at valley 2 and 7 bit errors at valley 6 out of 1000 reads of the upper logical page. The CenterEC of the upper logical page is 10 counts (3 bit errors at valley 2 and 7 bit errors at valley 6). CenterEC can be correlated to BER and can be used to determine BER for a particular logical page type. For instance, BER can include a ratio of a number of bits in error of a data vector (e.g., CenterEC for a logical page type) divided by a total number of bits for the given data vector (e.g., total number of bits read with respect to the particular logical page type). In the above example, if the total number of reads of the upper logical page is 1000 reads, the BER of the upper logical page is 1/100. Average CenterEC can refer to the average error count for all the read level threshold(s) (e.g., centered read level threshold) of a particular logical page type. Average CenterEC for a particular page logical type can be indicative of a relative BER of the logical page type with respect to other logical page types. For example, a first logical page type is associated with an average CenterEC that is greater than the average CenterEC of a second logical page type. Since the first logical page type has a greater average CenterEC than the second logical page type, it can be inferred that the BER of the first logical page type is higher than the BER for the second logical page type. The cRLC measurements, such as Diff-EC and CenterEC, can also be used for various types of program targeting operations (also referred to as "Dynamic Program Targeting (DPT) operations" herein).

A program targeting (PT) operation controls the program verify (PV) target placement such that the programming distributions are placed in a beneficial arrangement. A PV target can refer to voltage value or trim value used to program a memory cell at a given level. The PV target can set a threshold voltage (Vt) (e.g., minimum voltage at which a memory cell turns on or is conductive) of the memory cell. A PV target is associated with a particular programming distribution. For example, multiple memory cells that are programmed at a particular PV target can have threshold voltages that are within the corresponding program distribution. The program distribution can illustrate the range of threshold voltages (e.g., normal distribution of threshold voltages) for memory cells programmed at a particular PV target. The PT operation is a PV targeting calibration that can be done for each PV target. The PT operation can be considered as a set of one or more operations to adjust or calibrate the placement of PV targets.

The PT operation calibrates multiple logical page types such that the BER of each logical page type will be approximately the same through the life of the memory system and through all operating environments (e.g., minimizes BER). Additionally, the PT operation calibrates each particular logical page type to equalize the widths of valleys of each particular logical page type such that the RWBs for the valleys of each particular logical page type are approximately the same. For example, the PT operation can adjust the three TLC logical page types; lower logical page (LP), upper logical page (UP), and extra logical page (XP) such that the BER of each of these three logical page types will be approximately the same (i.e., balanced). The PT operation uses the cRLC as the feedback metric in a closed loop feedback system.

The PT operation, in addition to balancing logical page type BER, keeps the BER of each logical page type balanced dynamically by performing the PT operation during block programming, such as between the first programming pass and the second programming pass of a multi-pass programming operation on a block. Balancing the BER can reduce the average error correction trigger rate throughout the life of each die, including end-of-life (EOL) conditions. By adjusting PV targets, PT effectively moves the program distributions in the direction of the adjusted PV targets. PT calibration (e.g., adjusting the PV targets) can result in equalization of valley margins of a particular logical page type so that the valley margins are converged at a particular convergence value and the valley margins for a particular page type are roughly the same. PT calibration can also include balancing the BER of each logical page type so that each valley associated with a particular logical page has roughly similar RWB.

The PT operation can increase endurance (i.e., more total Program/Erase cycles) for each die in a memory system. Using the PT operation, no one logical page type will dominate the end of life criteria. The PT operation can be performed independently for each word line group. The PV targets of the memory component can start with manufacturing default PV targets. The PT operation can be run during a test mode so that all PV targets of all word line groups (WLGs) of all dies in the memory system have been balanced (i.e., when the BERs of the logical page types are approximately the same). In the test mode, the cRLC and PT operations can run at an accelerated rate for a short period of time at manufacturing so that each WLG will have optimized and converged the cRLC read level thresholds prior to deployment. The cRLC and PT operations can be performed in an interleaved or concurrent method so that the memory sub-system is continually maintained at its optimum and controlled valley margin through the life of the memory sub-system.

In operational mode (e.g., when in operation in the field), the cRLC and PT operations can be run dynamically to extend the usable lifetime of the memory components of the memory sub-system. The term "dynamic" as used herein can refer to processes, functions, operations, or implementations that occur during operation, usage, or deployment of a corresponding device, system, memory sub-system, or embodiment, and after or while running the manufacturer's or third-party firmware. The dynamically occurring processes, functions, operations, or implementations can occur after or subsequent to design, manufacture, and initial testing, setup or configuration (e.g., after test mode). In some conventional memory sub-systems, PV targets of the memory component are set with manufacturing default PV targets, and the default PV targets are not changed at any point during the life of the memory component. In other conventional memory sub-systems, some PV targets of the memory component are changed dynamically in the field. However, the PV target of the program distribution adjacent (also referred to as the "second program distribution" herein) to the initial program distribution and the last program distribution are not part of the group of PV targets that are allowed to be changed or adjusted.

Page margins are related to the total amount of white space (e.g., valley margin(s)) between programming distributions of a particular page type. Page margin for a particular logical page type can be correlated the total amount of valley margin for a particular logical page type. A page margin for a particular logical page type can be determined as a ratio of CenterEC of the particular logical page type to a baseline value. In some instances, the baseline value is the CenterEC of another logical page type. For example, for a word line group (WLG) of TLC memory cells the page margin for the upper logical page are the ratio of the CenterEC for the upper logical page to the CenterEC of the lower logical page, the page margin for the extra logical page is the ratio of the CenterEC of the extra logical page to the CenterEC of the lower logical page, and the page margin of the top logical page is the ratio of the CenterEC of the top logical page to the CenterEC of the lower logical page. Controlling page margins can control the amount of total white space (e.g., valley margin) that is given to each logical page type. For example, as the page margin for a particular logical page type increases, the total amount of valley margin between programming distributions for the particular logical page type decreases (e.g., inversely proportional), and vice versa.

In conventional memory sub-systems, page margin is not a metric that is used, and conventional memory sub-systems do not dynamically control or adjust page margins for logical page types.

Being able to control the amount of page margin that is given to a particular logical page type can be advantageous. For example, controlling the page margin of one or more logical page types effectively controls the amount of BER of each logical page type (e.g., tiered BER). For instance, page margins of the logical page types can be controlled so that, for example, in a TLC memory component the LP has a lower BER than the UP, and the UP has a lower BER than the XP. Controlling the page margin can contribute to a lower page stack BER than conventional systems that do not use page margins or control page margins. Additionally, controlling the page margin can lower write misplacement due to more robust pre-read during programming compared to conventional systems that do not control page margin.

In some situations, giving additional margin to certain logical page types because of memory component behavior can be advantageous. For example, the highest voltage distributions can exhibit more charge loss over time than the lower voltage distributions. Giving extra margin to the logical page types that includes the highest voltage distributions can reduce the susceptibility of these logical page types to charge loss. In another example, another memory component behavior is temperature effect on distribution voltage. It can be noted that in some situations where all logical page types have the same margin can mean that, in the case of a 1, 2, and 4 gray code where the LP has 1 valley and the UP has 2 valleys and XP has 4 valleys, the LP page bit errors are 4 times more sensitive to a valley shift than an XP. For example, if one of the valleys of an XP page shifted such that more errors are produced from this valley, they only account for ¼th of the total errors for an XP page. Whereas if the one valley of the LP page shifts the same amount then 100 percent of the errors are counted. In view of the above situation, it may be advantages to give the LP page more margin than the other logical page types.

It also can be noted that a logical page type with more margin has a lower BER. So when the error rate is balanced with page margin, the system balances BER, which works in the opposite direction of page margin. A page margin vector of 1-2-4 can also indicate that the BER is balanced when the LP has 4 times as many errors as the XP, and the UP has 2 times the number of errors as the XP. And, in this example, each valley will have the same RWB margin. In the case of a 1-1-1 page margin, all the logical page types will have the same bit error rate but the RWB margin will be 4 times greater for the XP than the LP. The higher RWB margin of a valley can indicate that the depth of the valley is greater. The depth of the valley being greater can indicate that the CenterEC is lower. For instance, the CenterEC of the XP page can be 4 times lower than the CenterEC of the LP page. When the CenterEC for all 4 valleys of the XP are added, the result is the same number of bit errors as the one valley CenterEC of the LP.

Aspects of the disclosure address the above challenges by adjusting the current page margin corresponding to a logical page type in accordance with a modified page margin. In some embodiments, center error counts (CenterECs) are determined for logical page types of the memory component. A first center error count is indicative of a number of bit errors for a first logical page type. A second center error count is indicative of a number of bit errors for a second logical page type. A modified page margin is determined based on a current page margin corresponding to the first logical page type. The current page margin corresponds to the first logical page type and is indicative of a ratio of the first center error count to the second center error count. The modified page margin is indicative of a modified ratio of a modified first center error count to the second center error count. The current page margin is adjusted corresponding to the first logical page type in accordance with the modified page margin.

In embodiments, the cRLC operation samples a WLG of the memory component and obtains measurement data such as Diff-EC and CenterEC. The measurement data is passed to the PT operation. The PT operation uses the Diff-EC and CenterEC to select from a set of rules that determine which PV targets to adjust, the direction the PV targets are to be adjusted, and the amount the PV targets are adjusted. Over multiple cRLC and PT operation cycles, the valley margins with a particular logical page type are equalized (e.g., margins are approximately the same between valleys of a particular logical page type) and the BER between the different logical page types are balanced. It can be noted that BER corresponds to CenterEC, such that that logical page types with a similar BER also have a similar CenterEC.

For example, a cRLC operation can be performed after a second pass programming. The cRLC operation can calibrate read level thresholds and sample the CenterECs associated with each of the logical page types of a multi-bit memory component. As noted above, CenterEC is indicative of a number of bit errors for a logical page type and can be used to determine BER of a logical page type. The CenterECs can be passed to the PT operation, where the PT operation balances the BER among the logical page types. In so doing, the CenterEC among the logical page types are made to be very close in value such that the CenterECs among logical page types converge towards a convergence value. It can be noted that in some instances the CenterECs among the logical page types do not equal the convergence value after convergence, but can approach the convergence value and can be close to the convergence value within an order of magnitude.

The characteristic of PT operations that balance BER and converge the CenterECs among logical page types towards a convergence value can be used to independently adjust page margins by using scale factors. Instead of using the raw CenterECs from the cRLC in the PT operation, the CenterECs from the cRLC operation can be modified so that the PT operation uses modified CenterECs. For instance, for a WLG of TLC memory the scale factors selected for lower logical page (LP), the upper logical page (UP), and extra logical page (XP) from the set of scale factors, such as [1.0, 2.0, 4.0,]. The first scale factor (1.0) is associated with the lower logical page (LP) and can be used a baseline value. The second scale factor (2.0) is associated with the UP, and the third scale factor (4.0) is associated with the XP. If for example, the cRLC returns a raw CenterECs for the LP, UP, and XP of 10, 40, and 120, respectively, the current page margins for the UP and XP are respectively 40/10 and 120/10. Scaling the CenterECs by the above scale factors of [1.0, 2.0, 4.0] result in the modified CenterECs of 10, 20, and 30 for LP, UP and XP respectively (e.g., divided by the respective scale factors), and result in the modified page margins for the UP and XP of 20/10 and 30/10 respectively. It can be noted that since the CenterEC for the LP is the baseline value the scale factor is 1.0, so that the raw CenterEC and modified Center EC, and the current page margin and modified page margin are the same.

The scaled CenterECs associated with the modified page margins, rather than the raw CenterECs associated with the current page margins, can be used at the PT operation. The PT operation calibrates the memory cell by adjusting one or more PV targets. By moving PV targets, the PT calibration balances the scaled BER among the logical page types such that the modified CenterECs are converged towards a convergence value (e.g., to some CenterEC value). For instance, PT calibration can converge the modified CenterECs among the logical page types towards a convergence value (e.g., CenterEC of approximately 10) so that each logical page type is balanced to have roughly similar BERs. The PV targets are adjusted so that the modified CenterEC of 20 associated with the UP is converged towards convergence value of 10, the modified CenterEC of 30 associated with the XP is converged towards a convergence value of 10, and the CenterEC of 10 associated with the LP remains close to 10. After PT calibration, the modified CenterEC of 10 for the UP is actually an unmodified value of 20 counts (e.g., multiplied by the 2.0 scale factor), and modified CenterEC of 10 count for the XP is actually an unmodified value of 40. The actual page margin using the unmodified CenterEC of the UP is 20/10 or 2, which aligns with the scale factor. The actual page margin using the unmodified CenterEC of the XP is 40/10 or 4, which also aligns with the respective scale factor.

As noted above, being able to control the amount of page margin that is given to a particular logical page type can be advantageous. For example, controlling the page margin of one or logical page types effectively controls the amount of BER for each logical page type (e.g., tiered BER). For instance, page margin of the logical page types can be controlled so that, for example, in a WLG of a TLC memory the LP has a lower BER than the UP, and the UP has a lower BER than the XP. Controlling the page margin can contribute to a lower page stack BER than conventional systems that do not use page margins or do not actively control page margins. Additionally, controlling the page margins can lower write misplacement due to more robust pre-read during programming compared to conventional systems that do not control page margins.

It can also be noted that for the sake of illustration, rather than limitation, aspects of the present disclosure are described with respect to TLC memory. It can be noted that aspects of the present disclosure can apply to any multi-bit memory, such as QLC, or other multi-bit memory.

FIG. 1 illustrates an example computing environment 100 that includes a memory sub-system 110 in accordance with some embodiments of the disclosure. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as a group of memory cells, word lines, word line groups (e.g., multiple word lines in a group), or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (e.g., processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the disclosure, a memory sub-system 110 cannot include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a page margin component 113 that performs operations as described herein. In some embodiments, the page margin component 113 can be part of host system 120, controller 115, memory component 112N, an operating system, or an application. Page margin component 113 can adjust the page margins associated with any of the logical page types of a multi-bit memory. For example, the controller 115 can include a processor 117 (processing device) configured to execute instructions stored in local memory 119 for performing the operations described herein.

Figure 2A:
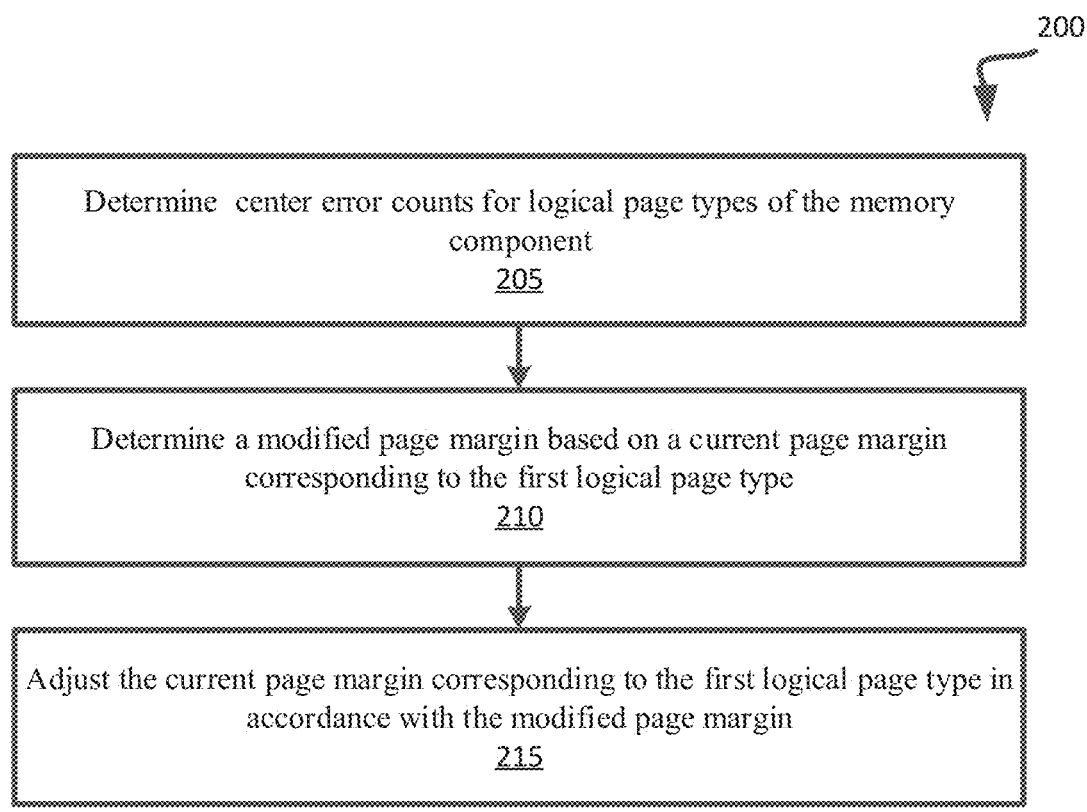
FIG. 2A is a flow diagram of an example method of adjusting the current page margin of a logical page type according to a modified page margin, in accordance with some embodiments of the disclosure.

FIG. 2A is a flow diagram of an example method for adjusting the current page margin of a logical page type according to a modified page margin, in accordance with some embodiments of the disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 200 is performed by the page margin component 113 of FIG. 1. Although shown in a particular order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment. Other operations flows are possible. In some embodiments, different operations can be used. It can be noted that although adjusting the page margin of a particular logical page type is described herein, aspects of the present disclosure can be used to adjust page margins of one or more of multiple logical page types of any type of multi-bit memory cells. For example, for a QLC memory aspects of the present disclosure can be used to adjust any of the page margins of the one or more of the logical page types (LPs, UPs, XPs, and TPs) of QLC memory.

At operation 205, processing logic performing method 200 determines CenterECs for multiple logical page types of the memory component. In embodiments, a first CenterEC of the multiple CenterECs is indicative of a number of bit errors for a first logical page type (e.g., upper logical page of TLC memory) of the logical page types (e.g., XP, UP, and LP of TLC memory). The second CenterEC of the multiple CenterECs is indicative of a number of bit errors for a second logical page type (e.g., lower logical page of TLC memory). In an example, processing logic receives the CenterECs for multiple logical page types (e.g., XP, UP, and LP) of a word line group of multi-bit memory, such as TLC memory.

In some embodiments, a cRLC operation is performed on the memory component to calibrate read level thresholds between programming distributions of a memory cell of the memory component. The cRLC operation determines multiple CenterECs by performing one or more read operations at the memory component. The cRLC operation can make various measurements, such as Diff-EC and CenterEC, and pass the measurements to subsequent operations. In some embodiments, processing logic receives the multiple CenterECs from the cRLC operation.

In embodiments, to perform the cRLC operation on the memory cell to calibrate the read level thresholds between the programming distributions, processing logic adjusts the read level thresholds to a center value that results in a lowest bit error rate. In embodiments, to perform a cRLC operation on the memory cell to calibrate read level thresholds between the programming distributions, processing logic samples data (e.g., read samples) using the center value (e.g., the centered read threshold value), a positive offset value, and a negative offset value between one or more of the programming distributions of the memory cell. The Diff-EC for a particular valley is determined from the read samples that are read using the center value, the positive offset value, and the negative offset value of the valley. The CenterEC for a particular logical page type is determined using the read samples that are read using the center values for all the valleys associated with the particular logical page type. The aforementioned read samples are measurements taken at one or more valleys between adjacent programming distributions. In embodiments a center value can be the lowest point in the valley, and can be used as the read level threshold. The positive offset value is a positive value (e.g., positive voltage value) from the center value. The negative offset value of the valley can be a negative value (e.g., negative voltage value) from the center value. In some embodiments, the positive offset value and the negative offset value are of the same magnitude. Center value, the positive offset value, and the negative offset value of the valley are further described with respect to FIGS. 3A and 3B.

In one embodiment, when a read sample is taken, three reads are performed in sequence, including a low Vt read, a high Vt read, and a center Vt read. The center Vt read is a register value that is a cRLC center value, the low Vt read is a register value that is the cRLC center value less a negative offset value, and the high Vt read is a register value that is the cRLC center value plus a positive offset value. If a read level threshold were to be swept by a BER sweep, the cRLC center value should be the lowest value in the valley between an adjacent pair of programming distributions. However, when the memory cell is not calibrated, the cRLC center value is not the lowest. In calibration, the cRLC operation centers the cRLC center value by balancing the side samples. In embodiments, in balancing the side samples the positive offset value and negative offset value are of equal magnitude. In some embodiments, to calibrate the read level thresholds, the cRLC operation balances the side samples for at least a particular logical page type. For example, for a particular logical page type all the respective positive offset values and the negative offset values are of equal magnitude for all the respective valleys. When the side samples are nearly equal (balanced), the cRLC center value can become centered at the deepest point in the BER sweep. For the read sample, a difference error count (Diff-EC) can be computed. The Diff-EC is the difference between the average of the positive and negative offset sample bit error rate counts and the center sample bit error count. Also, the center bit error count (CenterEC) is calculated. These values can be used to determine where the read level threshold should be set. The best BER for a logical page exists when all read level thresholds for that logical page type are centered by cRLC and the RWB for each logical page type valleys are approximately the same. The Diff-EC and CenterEC can be stored and used by the PT operation as feedback information in setting the PV targets. In some embodiments, after cRLC calibrates the read level thresholds between the programming distributions (e.g., second pass programming distributions), processing logic proceeds to operation 210. The cRLC operation is further described below with respect to FIG. 3A and FIG. 3B and FIG. 4.

At operation 210, processing logic determines a modified page margin based on a current page margin corresponding to the first logical page type. The current page margin corresponds to the first logical page type and is indicative of a ratio of the first CenterEC of the first logical page type to the second CenterEC of the second logical page type. In some embodiments, the modified page margin is indicative of a modified ratio of a modified first CenterEC of the first logical page type to the second CenterEC of the second logical page type. In some embodiments, the modified page margin is indicative of a modified ratio of a modified first CenterEC of the first logical page type to the modified second CenterEC of the second logical page type.

In some embodiments, to determine the modified page margin processing logic can modify the first CenterEC using a first scale factor associated with the first logical page type to generate the modified first CenterEC. Processing logic can determine the modified page margin for the first logical page type using the modified ratio of the modified first CenterEC to the second CenterEC.

For example, processing logic can receive the CenterEC (e.g., 40) for the upper logical page of TLC memory and the CenterEC (e.g., 10) for the lower logical page of the TLC memory. The current page margin for the upper logical page is the ratio of the CenterEC of the upper logical page to the CenterEC of the lower logical page (e.g., current page margin=40/10=4). Processing logic can also receive one or more scale factors associated with the page margin(s), such as a vector set of scale factors, to scale or modify the one or more page margins associated with respective logical page types. For instance, the scale factor for the upper logical page of TLC memory can be 2, and the scale factor for the extra logical page of TLC memory can be 4. It can be noted that in the current example, the CenterEC of the lower page is used as a baseline value, such that the page margin of any logical page type is a ratio of the CenterEC of the particular logical page type and the CenterEC of the lower logical page type. In the current example, to determine the modified page margin for the upper logical page, processing logic can modify the CenterEC associated with the upper logical page (e.g., 40) using the first scale factor (e.g., 2) associated with the upper logical page to generate the modified first CenterEC. For instance, the CenterEC associated with the upper logical page can be divided by the first scale factor (e.g., 2) to generate the modified first CenterEC (e.g., 20). The modified page margin is the modified ratio of the modified first CenterEC (e.g., 20) to the second CenterEC of the lower logical page (e.g., 10) (e.g., modified page margin=20/10=2). By modifying the current page margin to generate a modified page margin, processing logic can control the page margin for a particular logical page type and among multiple logical page types.

At operation 215, processing logic can adjust the current page margin corresponding to the first logical page type in accordance with the modified page margin.

In some embodiments, to adjust the current page margin corresponding to the first logical page type in accordance with the modified page margin, processing logic can perform a programing target (PT) operation on a memory cell of the memory component to adjust one or more program-verify (PV) targets associated with programming distributions of the memory cell in accordance with the modified page margin. In some embodiments, the PT operation converges the modified page margin corresponding to the first logical page type towards a convergence value.

In some embodiments, to adjust the current page margin corresponding to the first logical page type in accordance with the modified page margin, processing logic can perform a programing target (PT) operation on a memory cell of the memory component to adjust one or more program-verify (PV) targets associated with programming distributions of the memory cell to converge the modified first CenterEC and the second CenterEC towards a convergence value.

In some embodiments, to perform the PT operation on the memory cell of the memory component to adjust the one or more PV targets associated with the programming distributions of the memory cell to converge the modified first CenterEC and the second CenterEC towards the convergence value, processing logic can determine a first adjustment amount of a first PV target and a second adjustment amount of a second PV target that converges the modified first CenterEC and the second CenterEC towards the convergence value. Processing logic can adjust the first PV target by the first adjustment amount. Processing logic can adjust the second PV target by the second adjustment amount.

In some embodiments, the program targeting operation implements a set of rules to balance logical page types such that the BER is approximately the same for different logical page types and to equalize relative width of valleys of a particular logical page type such that the RWB for the valleys of the particular logical page type are approximately the same. Program targeting operation calibration converges Diff-EC for at least a particular logical page type towards a Diff-EC convergence value. For example, after cRLC convergence, the Diff-EC measurements obtained via the cRLC operation are passed to the PT operation. For a TLC memory cell, PT calibration converges the Diff-EC measurements for valleys 1-7 towards a Diff-EC convergence value (e.g., Diff-EC of approximately 60) so that each valley has roughly similar RWBs and the different logical page types have a similar BER.

In some embodiments, program targeting operation calibration also converges CenterEC among logical page types towards a convergence value (e.g., CenterEC convergence value). For example, after cRLC convergence, the CenterEC measurements obtained via the cRLC operation are passed to the PT operation. PT calibration converges the CenterEC measurements among different logical page types towards a convergence value (e.g., CenterEC) so that the CenterEC for each logical page type is roughly the same and the different logical page types have a similar BER. It can be noted that CenterEC is related to BER, such that if the CenterEC measurements between logical page types are roughly the same, the BER for different logical page types will also be similar.

In an example where a modified page margin is not used, the CenterEC for the upper logical page of TLC memory is 40 and the CenterEC for the lower logical page of the TLC memory is 10. The current page margin for the upper logical page is the ratio of the CenterEC of the upper logical page to the CenterEC of the lower logical page (e.g., current page margin of the upper logical page=40/10=4). CenterECs for the upper logical page and lower logical page are provided to the PT operation. The PT operation can adjust PV targets associated with the programming distributions so that the CenterECs for the upper logical page and lower logical page both converge towards a convergence value of 10. After the PT operation converges the CenterECs to the convergence value, the page margin of the upper logical page is 10/10 or 1.

In another example where a modified page margin is used, the CenterEC for the upper logical page of TLC memory is 40 and the CenterEC for the lower logical page of the TLC memory is 10. The current page margin for the upper logical page is the ratio of the CenterEC of the upper logical page to the CenterEC of the lower logical page (e.g., current page margin of the upper logical page=40/10=4). CenterECs for the upper logical page and lower logical page are provided to the PT operation. One or more scale factors are also provided to the PT operation to modify the page margin of one or more logical page types. For instance, the scale factor for the upper logical page of TLC memory can be 2. The CenterEC associated with the upper logical page can be divided by the first scale factor (e.g., 2) to generate the modified first CenterEC (e.g., 20). The modified page margin is the modified ratio of the modified first CenterEC (e.g., 20) to the second CenterEC of the lower logical page (e.g., 10) (e.g., modified page margin=20/10=2). The PT operation can adjust PV targets associated with the programming distributions so that the modified CenterEC for the upper logical page and CenterEC for the lower logical page both converge towards a convergence value of 10. After the PT operation converges the modified CenterEC for the upper logical page and CenterEC for the lower logical to approximately the convergence value, the new page margin of the upper logical page is 10/10 or 1 (e.g., modified ratio of the modified CenterEC of upper logical page after PV target adjustment to the CenterEC of lower logical page after PV target adjustment). Since the CenterEC for the upper logical page has been modified (e.g., divided by the scale factor of 2), the actual CenterEC of the upper logical page is 20 (e.g., multiply the same scale factor of 2), which makes the actual page margin of the upper logical page match or approach the modified page margin. In some embodiments, to calibrate the one or more PV targets associated with the programming distributions, processing logic determines a net-zero adjustment to at least two PV targets associated with the programming distributions based on two or more difference error counts. Processing logic adjusts the at least two PV targets according to the net-zero adjustment. In some embodiments, not all PV targets are adjusted. For example, the first and last PV targets can be fixed and only the intervening PV targets are adjusted. PV target adjustments and net-zero adjustments are further described with respect to FIG. 4.

Operations described herein can be performed on a data block (e.g., a group of memory cells), a word line group, or a word line. For example, the operations described with respect to a memory cell in the disclosure can also be used with a data block that is a group of memory cells. In some embodiments, the current page margin corresponding to the first logical page type is adjusted dynamically over a lifetime of the memory component. In some embodiments, the memory component includes a block. The block includes memory cells organized in multiple word line groups. The current page margins of a first word line group of the multiple word line groups are adjusted independently from other current page margins of a second word line group of the multiple word line groups. In some embodiments, different word line groups of a memory component can have different scale factors, and different modified page margins from other word line groups of the same memory component.

FIG. 2B is a flow diagram of an example method 250 for adjusting one or more program verify (PV) targets according to a modified page margin, in accordance with some embodiments of the disclosure. The method 250 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 250 is performed by the page margin component 113 of FIG. 1. Although shown in a particular order, unless otherwise specified, the order of the operations can be modified. Thus, the illustrated embodiments can be understood only as examples, and the illustrated operations can be performed in a different order, and some operations can be performed in parallel. Additionally, one or more operations can be omitted in various embodiments. Thus, not all operations are required in every embodiment. Other operations flows are possible. In some embodiments, different operations can be used. It can be noted that although adjusting one or more PV targets in accordance with the modified page margin is described herein, aspects of the present disclosure can be used to adjust page margins of one or more of multiple logical page types of any type of multi-bit memory cells. Aspects described with respect FIG. 2A, can be implied as also being used in method 250 whether or not the aspects are explicitly described with respect to FIG. 2B.

At operation 255, processing logic executing method 250 can receive a first CenterEC associated with a first logical page type of the memory component and a second CenterEC associated with a second logical page type of the memory component.

In some embodiments, to receive a first CenterEC associated with a first logical page type of the memory component and a second CenterEC associated with a second logical page type of the memory component, processing logic can perform a continuous read level calibration (cRLC) operation on the memory component to calibrate read level thresholds between programming distributions of a memory cell of the memory component. Processing logic can determine the first CenterEC associated with the first logical page type of the memory component and the second CenterEC associated with the second logical page type of the memory component by preforming one or more read operations at the memory component.

At operation 260, processing logic can generate a modified page margin based on a current page margin associated with the first logical page type by modifying the first CenterEC by a first scale factor. The current page margin associated with the first logical page type is indicative of a ratio of the first CenterEC to the second CenterEC. In some embodiments, the modified page margin is indicative of a modified ratio of the modified first CenterEC to the second CenterEC. In some embodiments, the modified page margin is indicative of a modified ratio of the modified first CenterEC to the modified second CenterEC.

In some embodiments, to generate a modified page margin for the first logical page type by modifying the first CenterEC by a first scale factor, processing logic can modify the first CenterEC using the first scale factor associated with the first logical page type. Processing logic can determine the modified page margin associated with the first logical page type using the modified ratio of the modified first CenterEC to the second CenterEC. In some embodiments, Processing logic can determine the modified page margin associated with the first logical page type using the modified ratio of the modified first CenterEC to the modified second CenterEC.

At operation 265, processing logic can adjust one or more program verify (PV) targets associated with programming distributions of the memory component in accordance with the modified page margin.

In some embodiments, to adjust one or more PV targets associated with programming distributions of the memory component in accordance with the modified page margin, processing logic can adjust the one or more PV targets associated with the programming distributions of the memory component to converge the modified first CenterEC and the second CenterEC towards a convergence value.

In some embodiments, to adjust the one or more PV targets associated with the programming distributions of the memory component to converge the modified first CenterEC and the second CenterEC towards the convergence value, processing logic can determine a first adjustment amount of a first PV target and a second adjustment amount of a second PV target that converges the modified first CenterEC and the second CenterEC towards the convergence value. Processing logic can adjust the first PV target by the first adjustment amount. Processing logic can adjust the second PV target by the second adjustment amount.

Figures 3A, 3B:
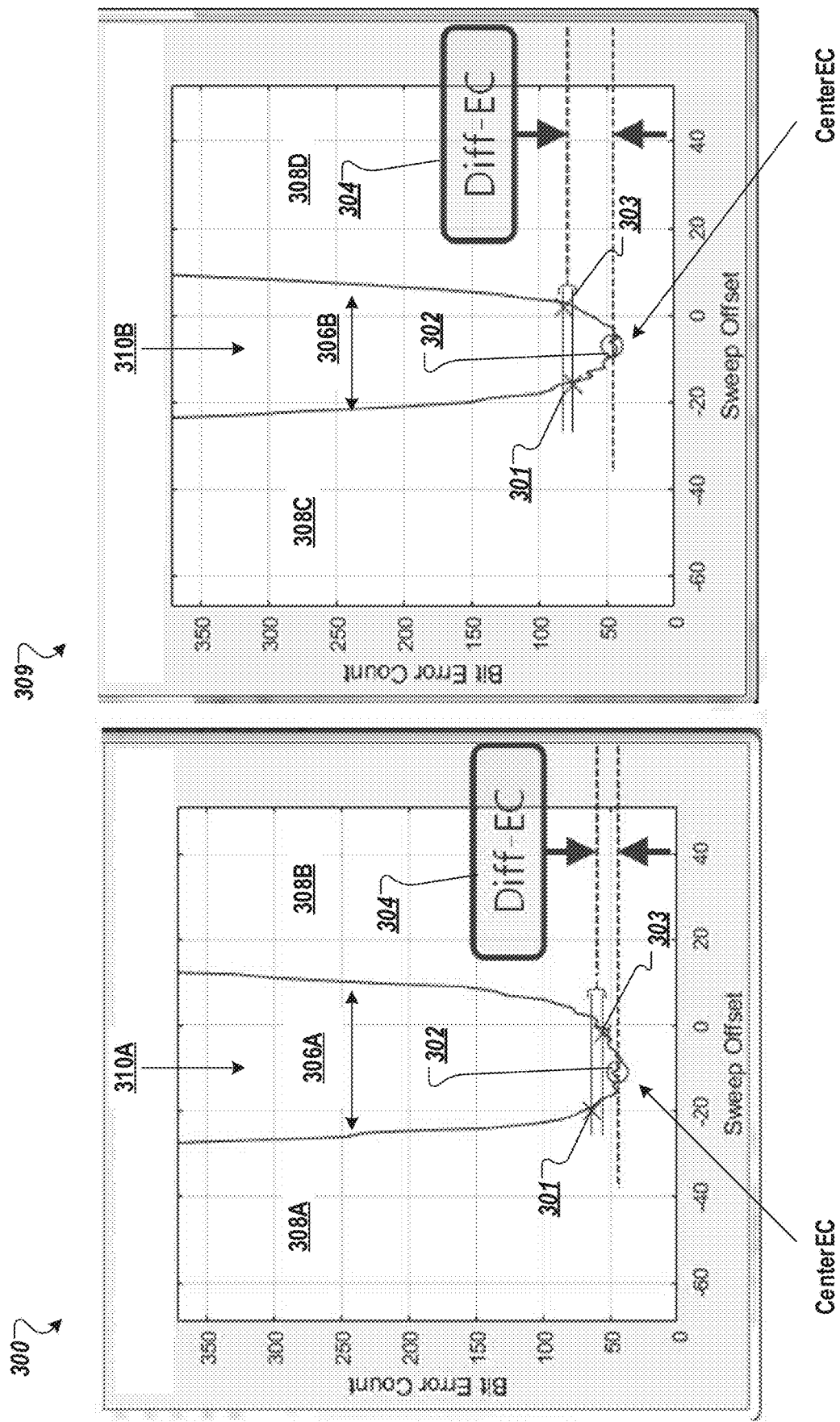
FIGS. 3A-3B illustrate difference error counts of two read level thresholds between two adjacent program distributions, in accordance with some embodiments of the disclosure.

FIGS. 3A-3B illustrate difference error counts of two read level thresholds between two adjacent program distributions, in accordance with some embodiments of the disclosure. Graph 300 shows a valley 310A between a pair of adjacent programming distributions 308A and 308B. Valley 310A-B can refer to the area between two adjacent distributions. Valley margin 306A is also shown between programming distributions 308A and 308B. Graph 309 shows a valley 310B between a pair of adjacent programming distributions 308C and 308D. Valley margin 306B is also shown between programming distributions 308C and 308D. As noted above, valley margin 306A-B can refer to a relative width or relative margin between pairs of adjacent programming distributions. One or more of programming distributions 308A-308D are generally referred to as "programming distribution(s) 308" herein. One or more of valley margins 306A-306B are generally referred to as "valley margin(s) 306" herein. One or more of valleys 310A-310B are generally referred to as "valley(s) 310" herein.

In embodiments, the cRLC operation samples each logical page type in each WLG. Each sample can include 3 reads: low-sample 301, center-sample 302, and high-sample 303. As noted above, the cRLC operation calibrates or converges by obtaining a center value (e.g., read level threshold) that results in a lowest bit error rate (BER) for a particular logical page type. Convergence is when a read level trim (e.g., the digital value the represents the read level threshold voltage) has the value that returns the fewest number of page or code word errors. This is what is called the calibrated or centered value and results in the lowest BER. In addition to finding the center of the valley 310, the cRLC operation calibrates or converges by balancing the side samples (low-sample 301 and high-sample 303) so that that the low-sample 301 and the high-sample 303 are equal in magnitude for a particular valley and the other valleys associated with a particular logical page type. In some embodiments, the low-sample 301 and the high-sample 303 are equal in magnitude for all the valleys for all the logical page types (or for multiple logical page types). In some embodiments, the low-sample 301 and the high-sample 303 are equal in magnitude for at least some valleys of a particular logical page type. Graph 300 and graph 309 show examples of calibrated valleys with the center-samples 302 being balanced between the side samples (e.g., the 4 side samples in both graph 300 and 309 are roughly equal in magnitude). Graph 309 demonstrates wide valley behavior and graph 309 demonstrates narrow valley behavior. During cRLC sampling and updating, when the read level trims (e.g., trim registers) are centered, the value of the trim will start "dithering." Anytime a cRLC read level trim changes direction (increasing the trim value, then decreasing the trim value, and vice versa) is considered a dither. This action of dithering indicates the trim is centered. When dithering occurs for a trim, the center value will be set.

In embodiments, the center-samples 302 are used as feedback metrics by PT to equalize the LP/UP/XP error rates by moving PV targets slightly. For instance, the cRLC operation also obtains the center bit error count (CenterEC) by determining the error count for the center-samples of each read level trim. The CenterEC of a logical page type can be used to determine BER for a particular logical page type. For instance, BER can include a ratio of the CenterEC for a logical page type to the total number of bits sampled with respect to the particular logical page type. The PT operation can perform BER leveling by moving PV targets such that the CenterECs between logical page types are balanced (e.g., balancing). For example, the CenterECs between different logical page types can be roughly the same, such that the BER between the logical page types are balanced.

In some embodiments, in addition to center-samples 302 valley margin is also used to equalize the BER between the logical page types (LP/UP/XP). Within each logical page type, the respective valley margin(s) can also be controlled to have a reasonable match (e.g., be similar widths). The default PV targets can determine the depths of the valleys 310 between the program distributions 308, the depths being related to valley margin 306 of each valley 310. To determine the valley margin 306 of a program distribution 308, the cRLC operation can determine values of a metric that is indicative of the width (or depth) between adjacent pairs of programming distributions 308. In some embodiments, the metric is a difference error and values of the metric are difference error counts (Diff-EC) (also referred to as "Diff-EC measurement(s)" herein). The difference error can be inversely proportional to the valley margins. For example, as illustrated the Diff-EC of graph 300 is smaller than the Diff-EC of graph 309, and valley margin 306A of graph 300 is larger than valley margin 306B of graph 309. The cRLC operation can determine the Diff-EC measurements 304. The Diff-EC measurements 304 can be used to identify relative valley margins. The Diff-EC measurements 304 can be the mean of the two side samples 301, 303 minus the center-sample 302. The PT operation can perform BER leveling by moving PV targets to match not only the CenterECs between logical page types (e.g., balancing), but also match the valley margins within each logical page type (or within all the logical page types) (e.g., equalizing). It can also be noted that valley margin can be correlated to valley depth (e.g., from peak to trough between program distributions). For example, a deep valley can correlate to a narrower valley margin as compared to a shallow valley (e.g., less deep valley) that correlates to a wider valley margin.

It can also be noted that the center-sample error count can be the CenterEC of the center-samples 302 (e.g., vertical axis of graph 300 and 309). Despite the center-sample error counts balancing, the valley margin (or depth) can be dramatically different even within the valleys of different logical page types (UP & XP). To determine which valley has the largest valley margin or the smallest valley margin, the measure of Diff-EC can be reliably used. The higher the Diff-EC measurement 304, the narrower the valley margin (or the RWB is smaller). The offsets between the low-sample 301, center-sample 302, and high-sample 303 for different Diff-EC measurements 304 are equal for purposes of comparison. In some embodiments, the cRLC operation can keep multiple samples (e.g., 16 samples) of each cRLC trim of each die. Once all the cRLC trim is centered, the center-samples 302 (and the corresponding CenterEC) and Diff-EC measurements 304 can be stored for a subsequent execution of a PT operation.

As illustrated, the example of FIG. 3A has a lower Diff-EC measurement 304 than the example of FIG. 3B, which means the program distributions have a larger valley margin and is less-needy. The terms More-Needy and Less-Needy refer to the relative valley margins of valleys which apply to the same logical page type within a WLG. In other words, the Most-Needy valley for a logical page type will be the one that is dominating the Error Count or causing more BER loss than any other valley. The Diff-EC measurements can be used to determine More-Needy vs. Less-Needy valleys, including the order of Needy-Ness (most to least needy). For example, for a particular logical page type the valley with the largest Diff-EC is the Most-Needy valley (has the smallest valley margin) of the valley(s) of the particular logical page type. In another example, for a particular logical page type the valley with the smallest Diff-EC is the Least-Needy valley (has the largest valley margin) of the valley(s) of the particular logical page type. When a TLC page stack page BER is balanced, the LP (L3/L4) will have the lowest RWB, the UP (L1/L2 and L5/L6) will be a bit higher and should be about equal, and XP (L2/L3, L4/L5, and L6/L7, notice that L0/L1 is ignored because it is special) will be the highest RWB. Accordingly, the valleys of LP will have the lowest valley margins, the valleys of UP will have a bit higher valley margin, and the valleys of XP will have the highest valley margin. It should be noted that a balanced BER causes the RWB to gravitate (e.g., equalize) to a value where the RWB for valleys of a particular logical page type are approximately the same, which occurs as a natural byproduct of the PT operation.

Figure 4:
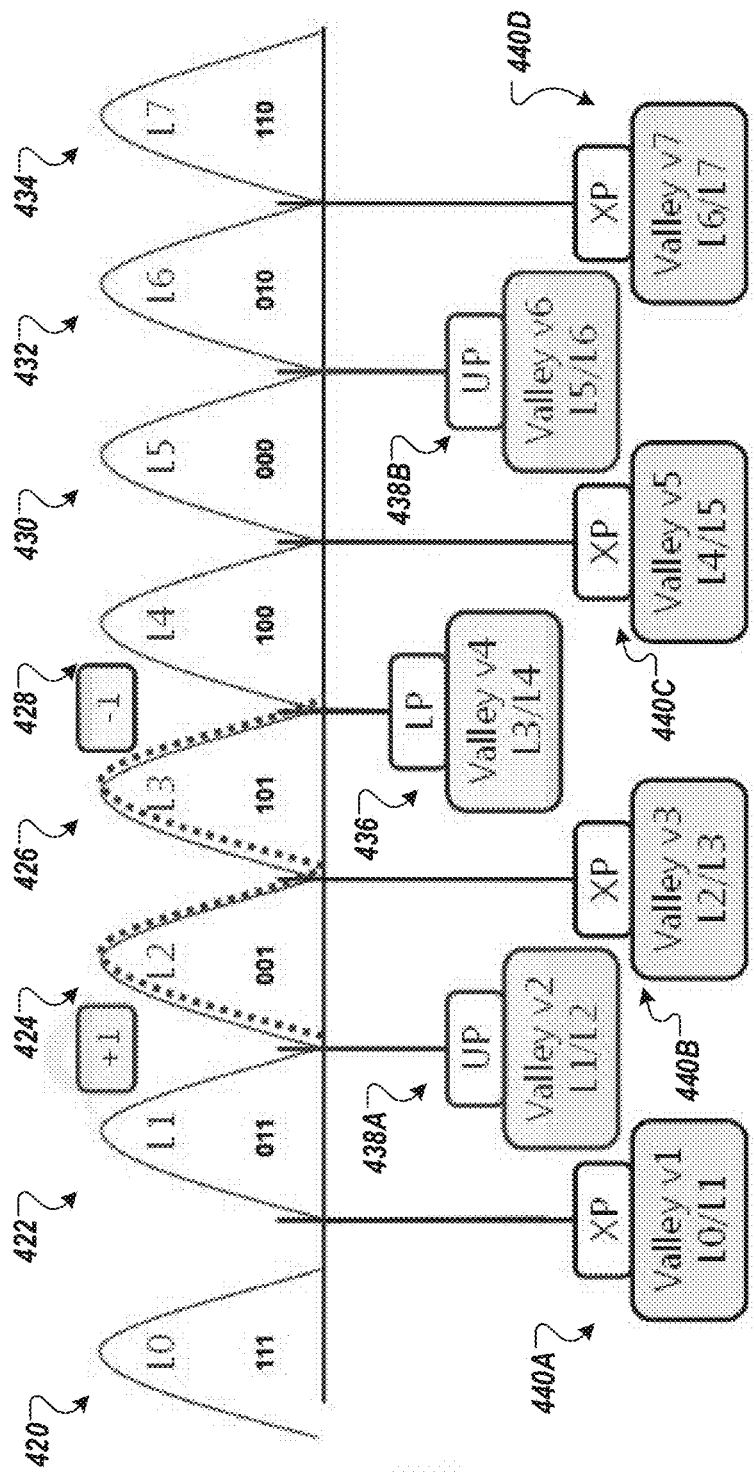
FIG. 4 illustrates eight programming distributions, including two programming distributions after at least two of the program verify targets are adjusted according to a program targeting (PT) operation, in accordance with some embodiments of the disclosure.

FIG. 4 illustrates eight programming distributions, including two programming distributions after at least two of PV targets are adjusted according to a PT operation, in accordance with some embodiments of the disclosure. As illustrated in FIG. 4, most of the data in each block is stored as TLC information, including 3 bits per cell. This is accomplished using eight programming distributions 420-434. A lower logical page (LP) is defined with one read level threshold 436 (e.g., approximately at the center between programming distributions 426 and 428). An upper logical page (UP) is defined with two read level thresholds 438A and 438B (generally referred to as "read level threshold(s) 438" herein). An extra logical page (XP) is defined with fourth read level thresholds 440A-440D (generally referred to as "read level threshold(s) 440" herein). The eight programming distributions 420-434 each correspond to a level (L0:L7), each level corresponding to a code (000:111). Between each pair of eight programming distributions 420-434 is a valley, totaling seven valleys (v1:v7). A center or peak of each programming distribution 420-434 corresponds to a PV target for the respective programming distribution 420-432. In total, there can be eight PV targets for a 3-bit representation. In some embodiments, the first programming distribution 420, corresponding to the first level L0, has a fixed PV target. In some embodiments, the second programming distribution 422, corresponding to the second level L1, has fixed PV target. In some embodiments, the last programming distribution 434, corresponding to the eighth level L7, can have a fixed PV target. In some embodiments, one or more of the first programming distribution 420, corresponding to the first level L0, the second programming distribution 422, corresponding to the second level L1, and the eighth programming distribution 434, corresponding to the eight level L7, have fixed PV targets. It can be noted that FIG. 4 illustrates increasing voltage levels from right to left. For example, the programming distribution 420 has the lowest voltage level and is associated with the lowest PV target, and programming distribution 422 has the second lowest voltage level and the second lowest PV target. Programming distribution 434 has the highest voltage level and the highest PV target.

In the depicted embodiment, the PT operation starts with each PV target in a default state as defined by factory settings. In some embodiments, one or more of the first PV target of the initial program distribution (L0), the second PV target of the second program distribution (L1) and the last PV target of the last program distribution (L7) can be fixed, allowing the intervening PV targets to be adjusted. For example, with eight PV targets (of L0-L7), the L0, L1, and L7 PV targets are fixed and the other PV targets L2 through L6 can receive characterized starting values, leading to faster cRLC and PT operation conversion. Alternatively, the L0, and L7 PV targets are fixed and the other PV targets L1-L6 can be adjusted. These factory settings of the PV targets and read level thresholds can produce undesirable BER results before cRLC and PT operations.

In some embodiments, the PT operation can be defined as a net-zero PV target adjustment mechanism. Net-zero adjustments maintain a constant RWB for a memory cell. The total RWB for a memory cell of a multi-bit memory cell is constant, but the RWB between programming distributions can be adjusted by changing PV targets. Net-zero adjustments manages PV target adjustments for optimum BER and logical page type BER matching. The PT operation performs PV target adjustments in order to balance logical page type BER among the logical page types for improved BER sigma continuously throughout the life of a memory component or memory system. The PT operation, as described herein, can be performed between programming passes of a multi-pass programing operation, such as after a first programming pass or a second programming pass. The cRLC calibration is performed in order that allows for a subsequent PT operation. The cRLC measures and collects center bit error count (CenterEC) and difference error count (Diff-EC) information on the page stack and passes the information to a subsequent PT operation. Both cRLC and PT can be performed while a block is being programmed rather than after a block is fully programmed.

In embodiments, during programming of the selected block used for PT, the programming sequence is interrupted to perform cRLC. Programming interruption occurs at each logical page stack (selected as one of the cRLC logical page stacks). A logical page stack can refer to all the logical page types for a particular multi-bit memory cell. The program interruption occurs just before the second-pass programming when the first-pass distributions have fully aggressed floating gate coupling from their neighbors. During block programming each of the cRLC page stacks in each of the word line groups is interrupted and a cRLC is performed until all read level thresholds of the page stack are centered. The cRLC information from each valley, center error count (CenterEC) and difference error count (Diff-EC), is passed to the PT operation for determining Program Verify (PV) Target adjustments according to the PT rules. PV target adjustments are applied to the next block that is programmed and this process of interrupting and cRLC/PT continues as PT converges and finally dithers and then tracks NAND behavior. As noted above, by adjusting PV targets, PT effectively moves the program distributions in the direction of the adjusted PV targets. PT calibration (e.g., adjusting the PV targets) can result in valley margins of a particular logical page type to converge at a particular convergence value so that the valley margins for a particular logical page type are roughly the same. PT calibration can include balancing the BER of each logical page type so that each logical page type has roughly similar BER and roughly similar CenterEC. During PT PV target adjustment, when that value of the PV trim starts "dithering" (anytime a PV trim changes direction (increasing the trim value, then decreasing the trim value, and vice versa) is considered a dither), the PT operation for the respective program distribution has converged.

A program target offset is defined as the difference in position of a PV distribution relative to the default starting value. For example, the PV targets for L2 and L3 first slew to the right by a certain amount (e.g., by about 130 mv) and then stop slewing and start dithering, which is stabilization (or calibrated). The valley after L3 is the L3/L4 valley (v4), the center value of which is the read level threshold 436 (corresponding to the LP Read Level). This movement is caused by balancing the BER of the LP page with respect to other logical pages. All PV targets can be stabilized after a number of P/E cycles (e.g., ~40 P/E cycles). It can take some time to stabilize the PV targets as the operation alternates between LP/UP and LP/XP adjustments with a maximum movement of 1 click (e.g., 10 mv). It is possible to characterize these offsets in many die, producing a head start set of offsets, providing nearly balanced BER at time zero.

As described herein, BER balancing can be performed as a net-zero adjustment. As illustrated in FIG. 4, one click (e.g., 10 mv) is given to one level (e.g., labeled as +1) and one click (10 mv) is taken from another level (e.g., labeled as −1). PT operations can adjust both UP and XP (and TP in QLC memory) relative to LP, resulting in BER balancing and RWB equalization of all three TLC logical page types (or all four logical page types in QLC memory, all logical page types of multi-bit memory). It should be noted that it is possible to give more RWB to higher distributions if required for undesirable NAND behavior like retention for example.

In some embodiments to balance the BER, some of the RWB of a logical page type that has a lower BER will be given to a different logical page type with a higher BER. In particular, the margin of a valley (having the highest valley margin of the valleys of the logical page type) of the logical page type that has the lower BER will be decreased, and the margin of the valley (having the lowest valley margin of the valleys of a different logical page type) of a different logical page type that has the higher BER will be increased (e.g., net-zero adjustment). By balancing the BER across logical page types of a WLG, the BERs across the multiple logical page types are approximately the same, and the CenterEC across the multiple logical page types are approximately the same, and the page margins across the multiple logical page types are approximately the same.

In embodiments, the eight programming distributions 420, 422, 424, 426, 428, 430, 432, and 434 each correspond to a level (L0:L7), each level corresponding to a code (000:111). In some embodiments, the code represents gray code. Gray code refers to a binary numeral system were two successive valleys differ in only one bit (e.g., binary digit). It can be noted that in other embodiments, a different gray code can be used.

Figure 5A:
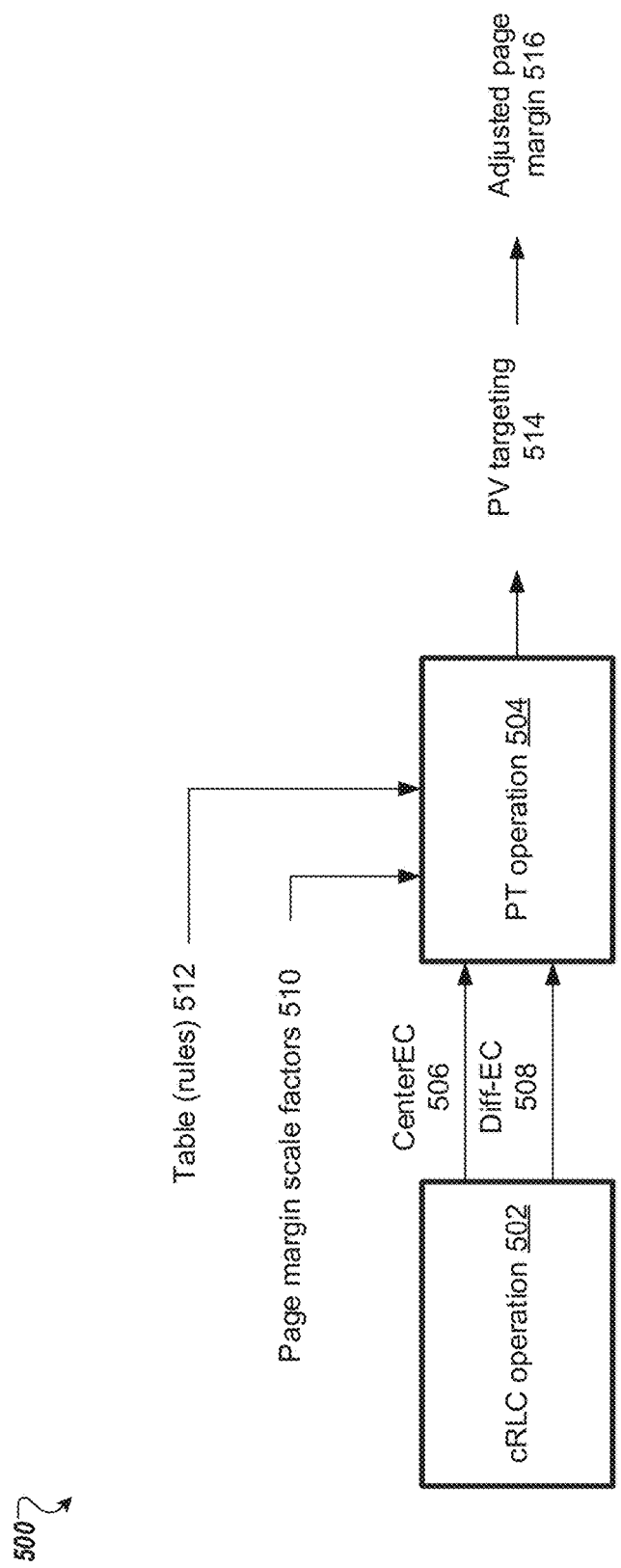
FIG. 5A illustrates a diagram of the operations and data for adjusting a current page margin associated with a logical page type, in accordance with embodiments of the disclosure.

FIG. 5A illustrates a diagram of the operations and data for adjusting a page margin associated with a logical page type, in accordance with embodiments of the disclosure. Diagram 500 illustrates the cRLC operation 502 and the PT operation 504. As described herein, the cRLC operation 502 samples the memory component (e.g., a WLG of the memory component), and passes the measurements, such as CenterEC 506 and Diff-EC 508, to PT operation 504. PT operation also receives additional information such as page margin scale factors 510 and a table (e.g., set of rules) 512. In some embodiments, margin scale factors 510 and a table (e.g., set of rules) 512 can be retrieved from volatile or non-volatile memory associated with memory component. The page margin scale factors 510 can be used to modify the page margins (e.g., modified page margins) for one or more logical page types of the WLG. The table 512 can include a set of rules that determine which PV targets to adjust based on metrics such a CenterEC 506 and Diff-EC 508. The PT operation adjusts PV targets of one or more programming distributions based on the table 512, as illustrated by PV targeting operation 514. Responsive to adjusting the PV targets, the programming distributions are moved such that the current page margins of the logical page types are adjusted in accordance with the modified page margins. In some embodiments, the sequence of cRLC operation 502 followed by PT operation 504 can be iterated multiple times to adjust the current page margin in accordance with the modified page margin.

Figure 5B:
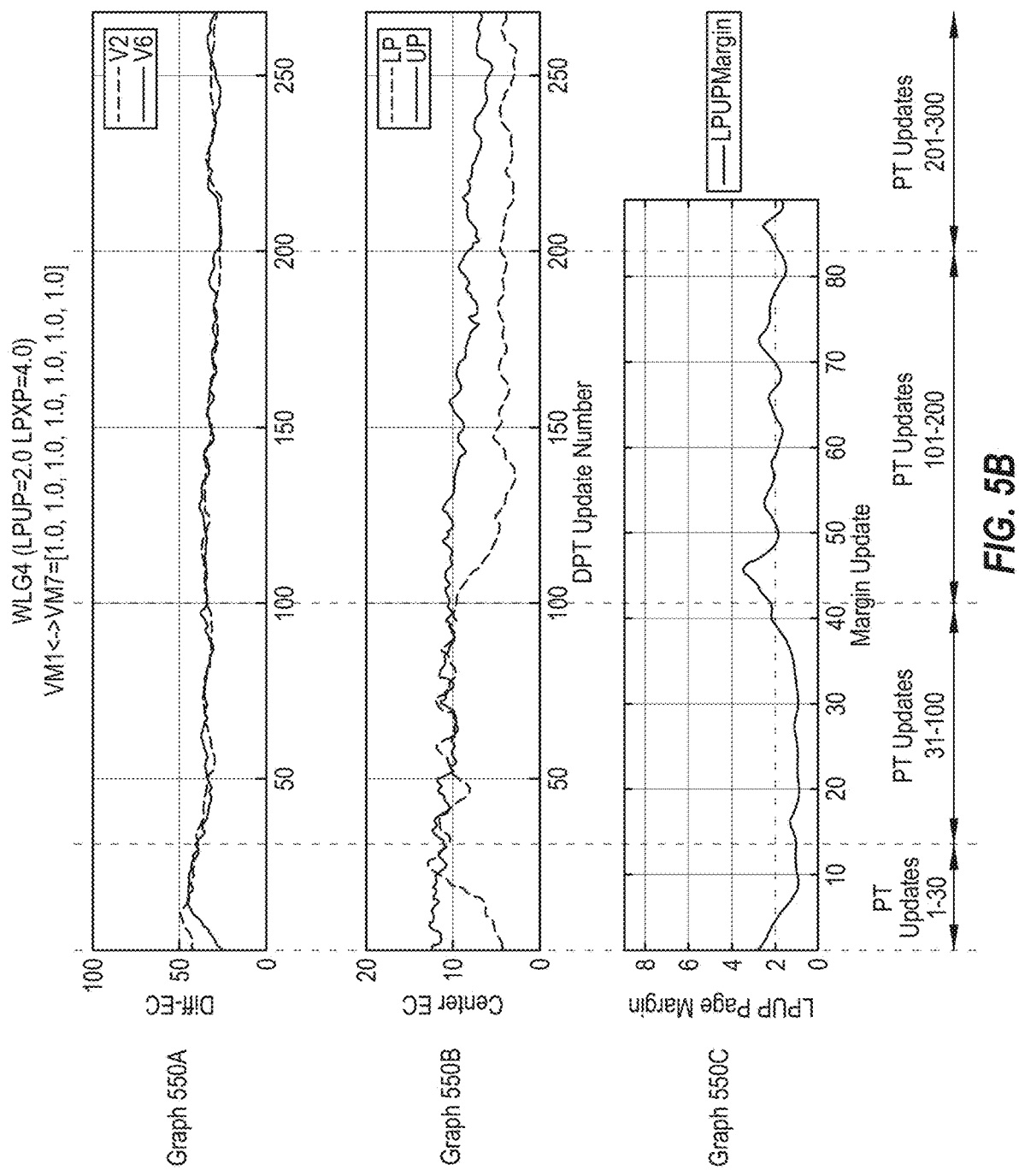

FIGS. 5B and 5C show graphs that illustrate program targeting (PT) operations that adjust the current page margins of a logical page types according to the modified page margins, in accordance with embodiments of the disclosure. Graph 550A, 550B, 550C, 550D, 550E, and 550F (generally referred as "graph(s) 550" herein) show changes to the Diff-EC, CenterEC, and page margin for a word line group of TLC memory over the course of 300 PT updates (e.g., PT operations). In some embodiments, each of the PT updates follows an execution of a cRLC operation. In the current illustration, the page margin scale factor for UP page margin (e.g., ratio of CenterEC of upper logical page to CenterEC of lower logical page, also referred to as "LPUP page margin" or "LPUP margin" herein) is 2 (e.g., modified page margin of 2), and the page margin scale factor for XP page margin (e.g., ratio of CenterEC of extra logical page to CenterEC of lower logical page, also referred to as "LPXP page margin" or "LPXP margin" herein) is 4 (e.g., modified page margin of 4). In FIG. 5B, graphs 550A, 550B, and 550C are associated with the adjustment of the current page margin of the upper logical page, and in FIG. 5C, graphs 550D, 550E, and 550F are associated with the adjustment of the current page margin of the extra logical page.

In FIG. 5B, graph 550A illustrates Diff-EC in the Y-axis and the number of PT updates in the X-axis. The graph plots the Diff-EC of valley 2 and valley 6 of the upper logical page over the course of 300 PT updates. The Diff-EC of the valley 2 and valley 6 start at different values, but quickly converge and stay equalized during a majority of the PT updates.

Graph 550B illustrates CenterEC in the Y-axis and the number of PT updates in the X-axis. The graph plots the CenterEC of the LP and the UP over the course of 300 PT updates. The CenterECs of the LP and UP start at different CenterECs. At roughly PT updates 31-100, the CenterECs of the LP and UP are balanced. At PT updates 101 to 300, the actual CenterECs of the LP and UP start to diverge in accordance with the modified page margin. It can be noted that the modified CenterEC of the UP and the CenterEC of the LP are converging towards a convergence value between PT updates 100-300 (not shown). The graph 550B shows the actual CenterECs of the LP and UP after each PT update.

Graph 550C illustrates the UP page margin in the Y-axis and the number of page margin updates in the X-axis. The number of page margin updates align with the number of PT updates in graph 550A and 550B with respect to time, rather than number. For example, the PT update 100 aligns with the $40^{th}$ page margin update with respect to time. As illustrated in graph 550C the LPUP page margin starts to approach the modified page margin of 2 after PT operation 100.

In FIG. 5C, graph 550D illustrates Diff-EC in the Y-axis and the number of PT updates in the X-axis. The graph plots the Diff-EC of valley 3, valley 5, and valley 7 of the extra logical page over the course of 300 PT updates. The Diff-EC of the valley 3, valley 5, and valley 7 start at different values, but quickly converge and stay equalized during a majority of the PT updates.

Graph 550E illustrates CenterEC in the Y-axis and the number of PT updates in the X-axis. The graph plots the actual CenterEC of the LP and the XP over the course of 300 PT updates. The actual CenterECs of the LP and XP start at different CenterECs. At roughly PT updates 31-100, the actual CenterECs of the LP and XP are balanced. At PT updates 101 to 300, the actual CenterECs of the LP and XP start to diverge in accordance with the modified page margin. It can be noted that the modified CenterEC of the XP and the CenterEC of the LP are converging towards a convergence value between PT updates 100-300 (not shown). The graph 550B shows the actual CenterECs of the XP and LP after each PT update.

Graph 550F illustrates the XP page margin in the Y-axis and the number of page margin updates in the X-axis. The number of page margin updates align with the number of PT updates in graph 550D and 550E with respect to time, rather than number. As illustrated in graph 550F the XP page margin starts to approach the modified page margin of 4 after PT operation 100.

Figure 6:
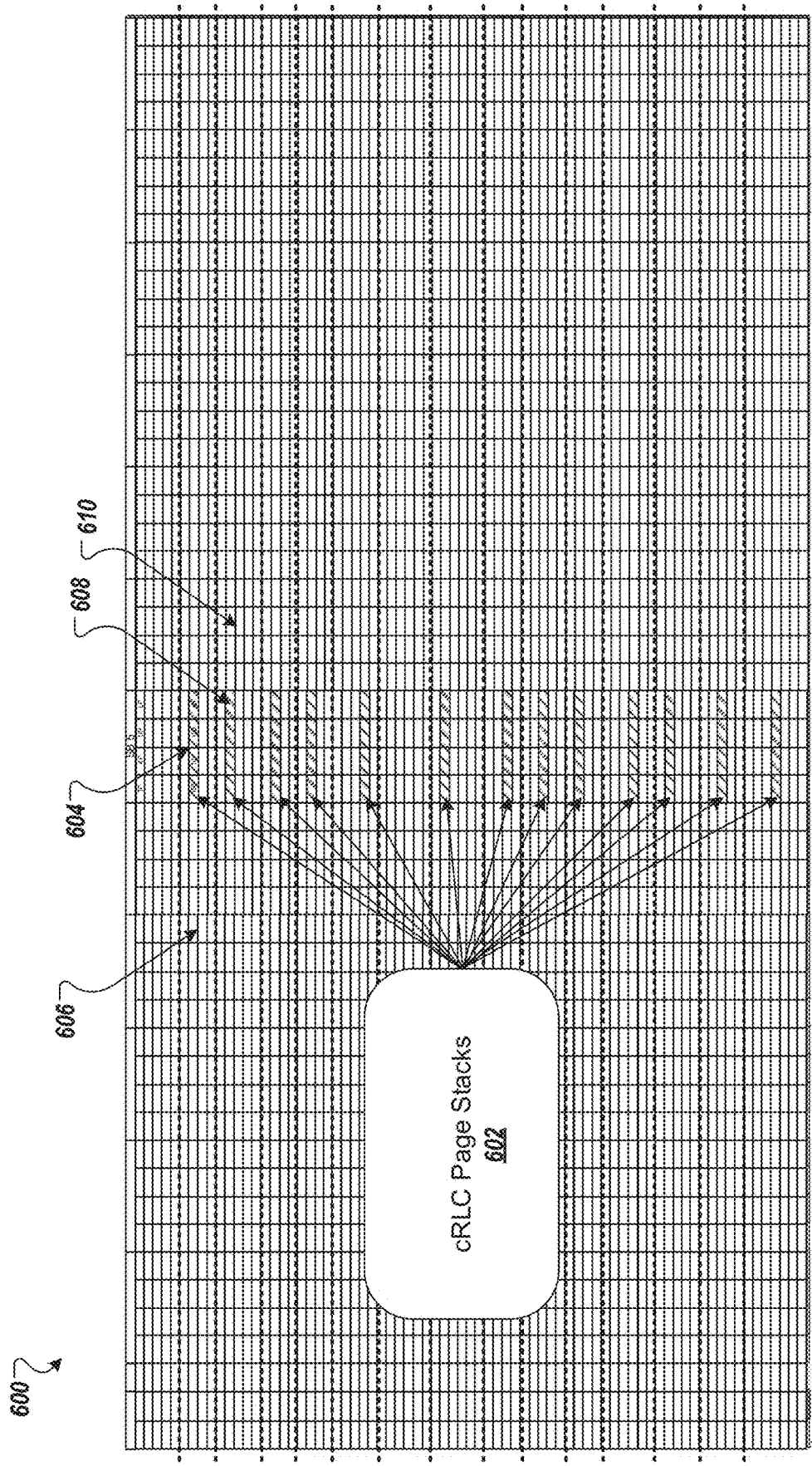
FIG. 6 is a page map of a memory block for a full block program operation with multiple continuous read level calibration (cRLC) page stacks, in accordance with some embodiments of the disclosure.

FIG. 6 is a page map 600 of a memory block for a full block program operation with multiple cRLC page stacks, in accordance with some embodiments of the disclosure. The page map 600 is a programming operation page map for a memory component having 38 word lines (WL) per block and 9 word line groups (WLGs) per block. The page map 600 can include sixteen sub-blocks in each block, where each sub-block of each WLG contains just one page type (e.g., LP, UP, XP, TP). The memory block can include SLC pages in the first and last WLGs, MLC pages in the second and second-to-last WLGs, and TLC pages in the intervening WLGs. Each read trim can be an N-bit offset register within the block. For example, an 8-bit offset register could be used where 7 bits are the magnitude and 1 bit is the sign convention. For each trim type, there can be a base trim value so that the offset trims for each page type are a +/− offset value relative to the base value. The offset value can correspond to the resolution of the trim.

During programming of the memory block selected for a cRLC operation, a block programming sequence is interrupted to perform cRLC. The programming interruption occurs at each page stack selected as one of the cRLC page stacks 602. The program interruption occurs just before a subsequent programming pass when the programming distributions from a previous programming operation have fully aggressed floating gate coupling from their neighbors. During block programming, each of the cRLC page stacks 602 in each of the word line groups is interrupted and a cRLC is performed until all valleys of the page stack are centered with minimum error rate. For example, during block programming the selected block, a first sample cRLC page stack 604 in a first word line group 606 is interrupted and a cRLC operation is performed until all valleys (read level thresholds) of the first sample cRLC page stack 604 are centered with minimum error rate. Similarly, during block programming the selected block, a second cRLC page stack 608 in a second word line group 610 is interrupted and a cRLC operation is performed until all valleys (read level thresholds) of the second sample cRLC page stack 608 are centered with minimum error rate. In one embodiment, the full cRLC operation is run until all trims within the first sample cRLC page stack 608 are confirmed to be at their minimum BER settings. Similarly, for the second sample cRLC page stack 608, the full cRLC operation is run until all trims are confirmed to be at their minimum BER settings. In another embodiment, the cRLC sampling and convergence to minimum BER settings is spread out over many programming operations. For example only one trim within the first sample cRLC page stack 604 gets one cRLC sample on a given block programming. The next block to be programmed would get the next cRLC sample for that trim and so on until enough blocks are programmed that all trims are converged to their minimum BER settings.

It should be noted that when used with the PT operation, the cRLC information from each valley is passed to the PT operation for determining PV target modifications. The cRLC information can include CenterEC, Diff-EC, other metrics, or the like.

Figure 7:
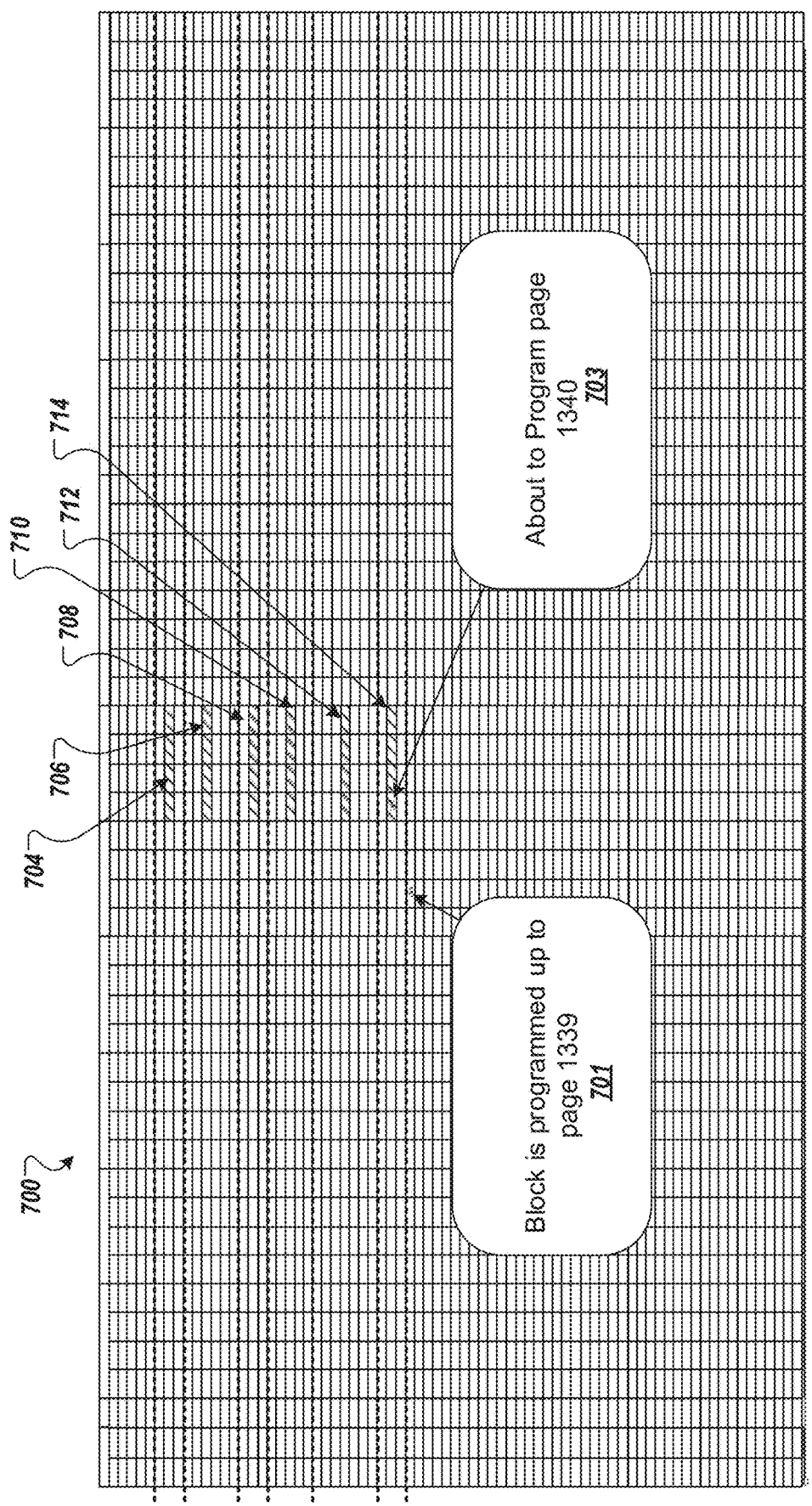
FIG. 7 is a page map of a memory block for a partial block program operation, in accordance with some embodiments of the disclosure.

FIG. 7 is a page map 700 of a memory block for a partial block program operation, in accordance with some embodiments of the disclosure. During programming of the memory block selected for a cRLC operation, a block programming sequence of the block is programmed up to a specified page 701, such as logical page 1339 as illustrated in FIG. 7. The block programming sequence is interrupted just before programming a next logical page 703 of the corresponding logical page, such as the top logical page 1340 as illustrated in FIG. 7. At this point, and at each of the other cRLC page stacks 704-714, the cRLC operation is allowed to fully converge the read level thresholds to become "centered" before the programming sequence is resumed. As described herein, the cRLC information can be passed on to PT to perform its rule based modification of the associated PV trims for the next programming operation.

Figure 8:
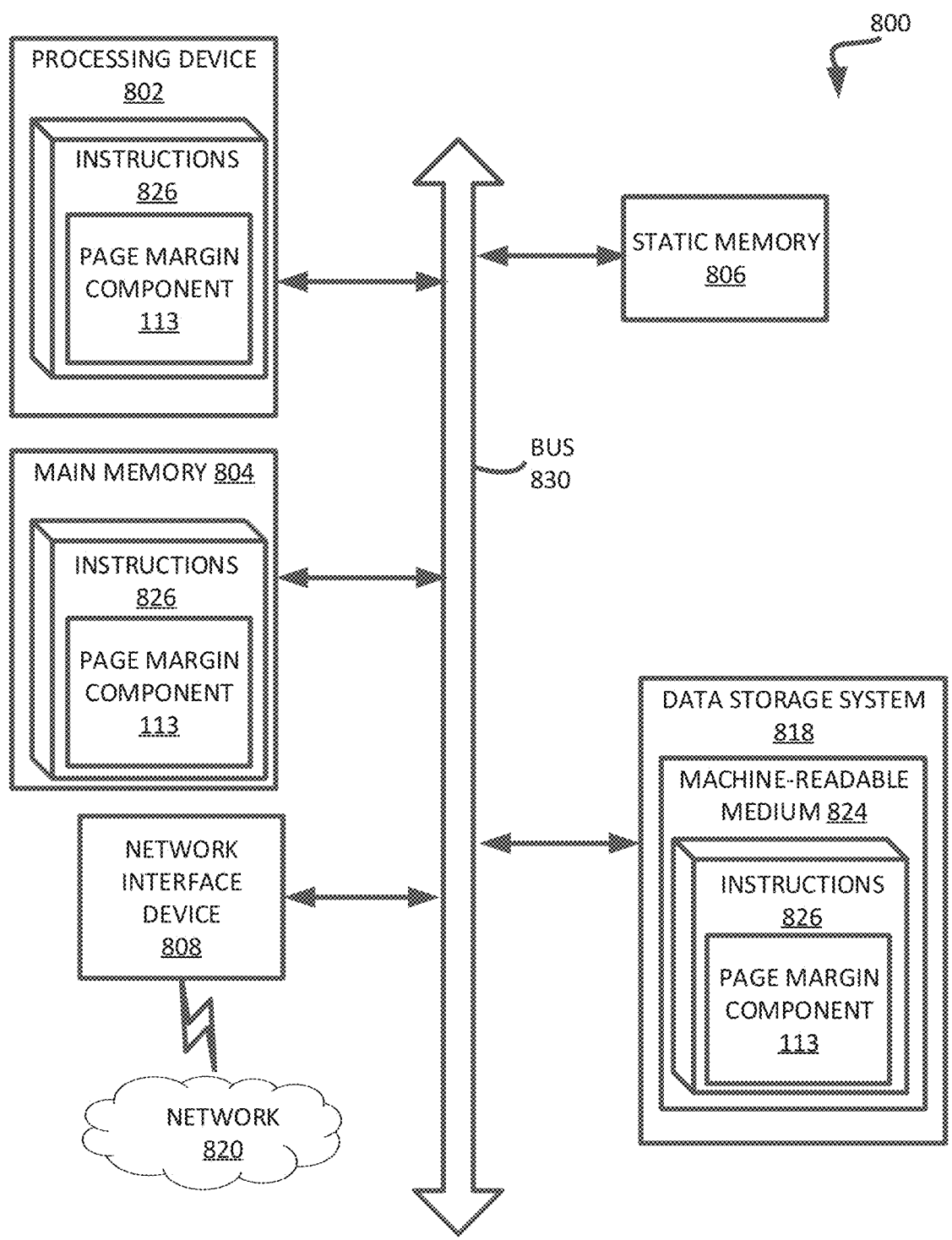
FIG. 8 illustrates an example machine of a computer system within which a set of instructions, for causing the machine to perform any one or more of the operations discussed herein, can be executed.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the page margin component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a non-transitory computer-readable storage medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to the page margin component 113 of FIG. 1. While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium"

shall accordingly be taken to include, but not be limited to, solid-state memories, optical media, and magnetic media.

Some portions of the preceding detailed descriptions have been presented in terms of operations and symbolic representations of operations on data bits within a computer memory. These algorithmic descriptions and representations are the ways used by those skilled in the data processing arts to most effectively convey the substance of their work to others skilled in the art. An algorithm or operation is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory component; and
   a processing device, operatively coupled with the memory component, to:
   determine a plurality of center error counts for a plurality of logical page types of the memory component, wherein a first center error count of the plurality of center error counts is indicative of a number of bit errors for a first logical page type of the plurality of logical page types, and wherein a second center error count of the plurality of center error counts is indicative of a number of bit errors for a second logical page type of the plurality of logical page types;
   determine a modified page margin based on a current page margin corresponding to the first logical page type, wherein the current page margin corresponding to the first logical page type is indicative of a ratio of the first center error count to the second center error count, and wherein the modified page margin is indicative of an additional ratio of a modified first center error count to the second center error count; and
   adjust the current page margin corresponding to the first logical page type in accordance with the modified page margin.

2. The system of claim 1, wherein to determine the modified page margin, the processing device is to:
   modify the first center error count using a first scale factor associated with the first logical page type to generate the modified first center error count; and determine the modified page margin for the first logical page type using the additional ratio of the modified first center error count to the second center error count.

3. The system of claim 1, wherein to adjust the current page margin corresponding to the first logical page type in accordance with the modified page margin, the processing device is to:
   perform a programing target (PT) operation on a memory cell of the memory component to adjust one or more program verify (PV) targets associated with programming distributions of the memory cell in accordance with the modified page margin.

4. The system of claim 3, wherein the PT operation converges the modified page margin corresponding to the first logical page type to approach a convergence value.

5. The system of claim 2, wherein to adjust the current page margin corresponding to the first logical page type in accordance with the modified page margin, the processing device is to:
   perform a programing target (PT) operation on a memory cell of the memory component to adjust one or more program verify (PV) targets associated with programming distributions of the memory cell to converge the modified first center error count and the second center error count to approach a convergence value.

6. The system of claim 5, wherein to perform the PT operation on the memory cell of the memory component to adjust the one or more PV targets associated with the programming distributions of the memory cell to converge the modified first center error count and the second center error count to approach the convergence value, the processing device is to:
   determine a first adjustment amount of a first PV target and a second adjustment amount of a second PV target that converges at of the modified first center error count and the second center error count to approach the convergence value;
   adjust the first PV target by the first adjustment amount; and
   adjust the second PV target by the second adjustment amount.

7. The system of claim 1, wherein to determine the plurality of center error counts for the plurality of logical page types of the memory component, the processing device is to:
   perform a continuous read level calibration (cRLC) operation on the memory component to calibrate read level thresholds between programming distributions of a memory cell of the memory component; and
   determine the plurality of center error counts by preforming one or more read operations at the memory component.

8. The system of claim 1, wherein the current page margin corresponding to the first logical page type is adjusted dynamically over a lifetime of the memory component.

9. The system of claim 1, wherein the memory component comprises a block, the block comprising a plurality of memory cells organized in a plurality of word line groups, wherein a plurality of current page margins of a first word line group of the plurality of word line groups are adjusted independently from another plurality of current page margins of a second word line group of the plurality of word line groups.

10. A system comprising:
    a memory component; and
    a processing device, operatively coupled with the memory component, to:
    receive a first center error count associated with a first logical page type of the memory component and a second center error count associated with a second logical page type of the memory component;
    generate a modified page margin based on a current page margin associated with the first logical page type by modifying the first center error count by a first scale factor associated with the first logical page type, wherein the current page margin associated with the first logical page type is indicative of a ratio of the first center error count to the second center error count, and wherein the modified page margin is indicative of an additional ratio of the modified first center error count to the second center error count; and
    adjust one or more program verify (PV) targets associated with programming distributions of the memory component in accordance with the modified page margin.

11. The system of claim 10, wherein to generate a modified page margin for the first logical page type by scaling the first center error count by a first scale factor, the processing device is to:
    modify the first center error count using the first scale factor associated with the first logical page type; and
    determine the modified page margin associated with the first logical page type using the additional ratio of the modified first center error count to the second center error count.

12. The system of claim 10, wherein to adjust one or more PV targets associated with programming distributions of the memory component in accordance with the modified page margin, the processing device is to:
    adjust the one or more PV targets associated with the programming distributions of the memory component to converge the modified first center error count and the second center error count to approach a convergence value.

13. The system of claim 12, wherein to adjust the one or more PV targets associated with the programming distributions of the memory component to converge the modified first center error count and the second center error count to approach the convergence value, the processing device is to:
    determine a first adjustment amount of a first PV target and a second adjustment amount of a second PV target that converges at of the modified first center error count and the second center error count to approach the convergence value;
    adjust the first PV target by the first adjustment amount; and
    adjust the second PV target by the second adjustment amount.

14. The system of claim 10, wherein to can receive a first center error count associated with a first logical page type of the memory component and a second center error count associated with a second logical page type of the memory component, the processing device is further to:
    perform a continuous read level calibration (cRLC) operation on the memory component to calibrate read level thresholds between programming distributions of a memory cell of the memory component; and
    determine the first center error count associated with the first logical page type of the memory component and the second center error count associated with the second logical page type of the memory component by preforming one or more read operations at the memory component.

15. A method comprising:
- determining, by a processing device, a plurality of center error counts for a plurality of logical page types of a memory component, wherein a first center error count of the plurality of center error counts is indicative of a number of bit errors for a first logical page type of the plurality of logical page types, and wherein a second center error count of the plurality of center error counts is indicative of a number of bit errors for a second logical page type of the plurality of logical page types;
- determining a modified page margin based on a current page margin corresponding to the first logical page type, wherein the current page margin corresponding to the first logical page type is indicative of a ratio of the first center error count to the second center error count, and wherein the modified page margin is indicative of an additional ratio of a modified first center error count to the second center error count; and
- adjusting the current page margin corresponding to the first logical page type in accordance with the modified page margin.

16. The method of claim 15, wherein determining the modified page margin, the method further comprising:
- modifying the first center error count using a first scale factor associated with the first logical page type to generate the modified first center error count; and
- determining the modified page margin for the first logical page type using the additional ratio of the modified first center error count to the second center error count.

17. The method of claim 15, wherein adjusting the current page margin corresponding to the first logical page type in accordance with the modified page margin, the method further comprising:
- performing a programing target (PT) operation on a memory cell of the memory component to adjust one or more program verify (PV) targets associated with programming distributions of the memory cell in accordance with the modified page margin.

18. The method of claim 17, wherein the PT operation converges the modified page margin corresponding to the first logical page type to approach a convergence value.

19. The method of claim 16, wherein adjusting the current page margin corresponding to the first logical page type in accordance with the modified page margin, the method further comprising:
- performing a programming target (PT) operation on a memory cell of the memory component to adjust one or more program verify (PV) targets associated with programming distributions of the memory cell to converge the modified first center error count and the second center error count to approach a convergence value.

20. The method of claim 15, wherein determining the plurality of center error counts for the plurality of logical page types of the memory component, the method further comprising:
- performing a continuous read level calibration (cRLC) operation on the memory component to calibrate read level thresholds between programming distributions of a memory cell of the memory component; and
- determining the plurality of center error counts by preforming one or more read operations at the memory component.

* * * * *